US012159811B2

(12) United States Patent
Qu

(10) Patent No.: US 12,159,811 B2
(45) Date of Patent: Dec. 3, 2024

(54) LIDDED MICROELECTRONIC DEVICE PACKAGES AND RELATED SYSTEMS, APPARATUS, AND METHODS OF MANUFACTURE

(71) Applicant: Micron Technology, Inc., Boise, ID (US)

(72) Inventor: Xiaopeng Qu, Redmond, WA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/804,492

(22) Filed: May 27, 2022

(65) Prior Publication Data

US 2022/0293486 A1    Sep. 15, 2022

Related U.S. Application Data

(63) Continuation of application No. 16/902,390, filed on Jun. 16, 2020, now Pat. No. 11,348,857.

(51) Int. Cl.
*H01L 23/367* (2006.01)
*H01L 23/31* (2006.01)
*H01L 23/373* (2006.01)
*H01L 21/50* (2006.01)
*H01L 21/56* (2006.01)
*H01L 23/04* (2006.01)
*H01L 23/538* (2006.01)

(52) U.S. Cl.
CPC ...... *H01L 23/3675* (2013.01); *H01L 23/3107* (2013.01); *H01L 23/373* (2013.01); *H01L 21/50* (2013.01); *H01L 21/56* (2013.01); *H01L 23/04* (2013.01); *H01L 23/5389* (2013.01)

(58) Field of Classification Search
CPC ............ H01L 23/3675; H01L 23/3107; H01L 23/373; H01L 21/50; H01L 23/5389; H01L 21/54; H01L 23/24; H01L 23/49816; H01L 23/367; H01L 23/10; H01L 23/18; H01L 25/0657; H01L 23/04; H01L 21/56
See application file for complete search history.

(56) References Cited

U.S. PATENT DOCUMENTS

| 6,379,997 B1 | 4/2002 | Kawahara et al. |
| 6,617,682 B1 | 9/2003 | Ma et al. |
| 6,617,683 B2 | 9/2003 | Lebonheur et al. |
| 6,794,223 B2 | 9/2004 | Ma et al. |

(Continued)

FOREIGN PATENT DOCUMENTS

| CN | 106489202 A | 3/2017 |
| CN | 109637939 A | 4/2019 |
| CN | 109690761 A | 4/2019 |

OTHER PUBLICATIONS

Chinese First Office Action for Chinese Application No. 202110646112.4, dated Aug. 24, 2022, 44 pages with translation.

*Primary Examiner* — Patricia D Valenzuela
(74) *Attorney, Agent, or Firm* — TraskBritt

(57) ABSTRACT

A microelectronic device package may include one or more semiconductor dice coupled to a substrate. The microelectronic device package may further include a lid coupled to the substrate, the lid defining a volume over and around the one or more semiconductor die. The microelectronic device package may further include a thermally conductive dielectric filler material substantially filling the volume defined around the semiconductor die.

20 Claims, 16 Drawing Sheets

(56) References Cited

U.S. PATENT DOCUMENTS

| | | |
|---|---|---|
| 7,005,738 B2 | 2/2006 | Zuo et al. |
| 7,220,624 B2 | 5/2007 | Neogi et al. |
| 7,394,659 B2 | 7/2008 | Colgan et al. |
| 7,510,108 B2 | 3/2009 | Lawlyes et al. |
| 7,608,923 B2 | 10/2009 | Hsu |
| 7,755,184 B2 | 7/2010 | Macris et al. |
| 9,401,315 B1 | 7/2016 | Bodenweber et al. |
| 11,348,857 B2 * | 5/2022 | Qu .................. H01L 23/3675 |
| 2003/0067070 A1 | 4/2003 | Kwon et al. |
| 2004/0036183 A1 | 2/2004 | Im et al. |
| 2005/0224953 A1 | 10/2005 | Lee et al. |
| 2008/0212288 A1 * | 9/2008 | Kang ................ H01L 23/3675 |
| | | 29/841 |
| 2015/0145114 A1 | 5/2015 | Higgins, III |
| 2015/0162307 A1 * | 6/2015 | Chen ................... H01L 21/56 |
| | | 438/107 |
| 2016/0111350 A1 | 4/2016 | Chen et al. |
| 2017/0358556 A1 | 12/2017 | Bitz et al. |
| 2018/0012865 A1 * | 1/2018 | Schrock ............ H01L 23/4334 |
| 2018/0233381 A1 | 8/2018 | Iruvanti et al. |

\* cited by examiner

LIDDED MICROELECTRONIC DEVICE PACKAGES AND RELATED SYSTEMS, APPARATUS, AND METHODS OF MANUFACTURE

CROSS-REFERENCE TO RELATED APPLICATION

This application is a continuation of U.S. patent application Ser. No. 16/902,390, filed Jun. 16, 2020, now U.S. Pat. No. 11,348,857, issued May 31, 2022, the disclosure of which is hereby incorporated herein in its entirety by this reference.

TECHNICAL FIELD

Embodiments of the disclosure relate to microelectronic device packages. Specifically, some embodiments relate to lidded microelectronic device packages, systems including lidded microelectronic device packages, and related apparatus, and methods of manufacture.

BACKGROUND

Microelectronic devices are commonly used in consumer electronics such as cell phones, tablets, computers, laptops, etc., as well as in servers and in automotive and industrial applications. As consumer electronics manufacturers continue to produce smaller and thinner versions of the consumer electronics while demanding greater performance and enhanced circuit density, packages of these microelectronic devices have become smaller and thinner to accommodate these requirements. Microelectronic device packages including high power components, for example, logic devices, microprocessor devices, graphics processor units (GPUs), application specific integrated circuits (ASICs), field programmable gate arrays (FPGAs), may generate amounts of heat detrimental to operation of the microelectronic devices of the package, as well as physical integrity of the package. As circuit density increases and form factors are reduced in combination with increases in performance, difficulties in heat dissipation increase while solutions for this issue become more problematic.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

DETAILED DESCRIPTION

Figure 1:
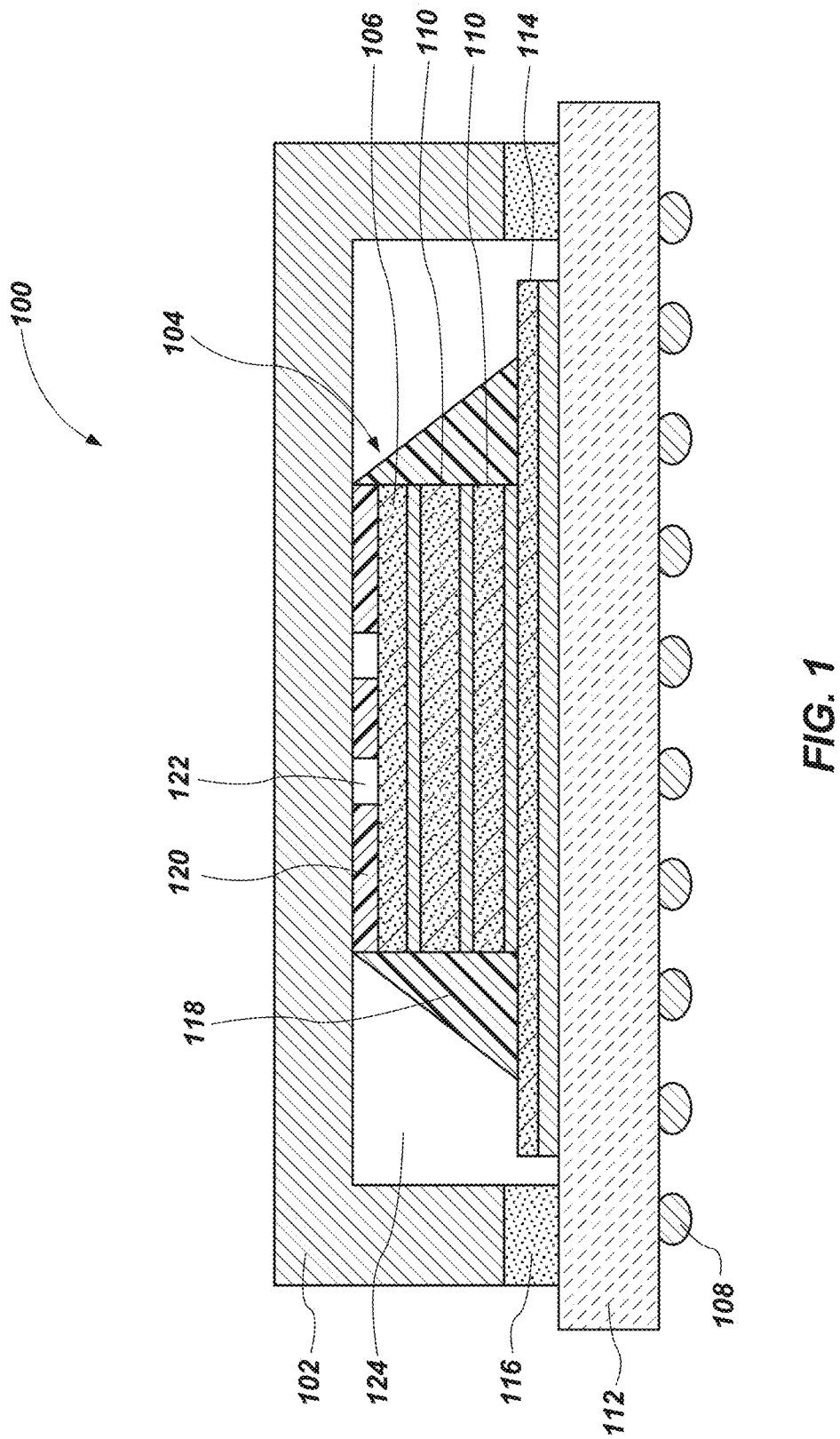
FIG. 1 illustrates a cross-sectional schematic view of an example lidded package.

The illustrations presented herein are not meant to be actual views of any particular microelectronic device or component thereof, but are merely idealized representations employed to describe illustrative embodiments. The drawings are not necessarily to scale.

As used herein, the term "substantially" in reference to a given parameter means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, at least about 99% met, or even at least about 100% met.

As used herein, relational terms, such as "first," "second," "top," "bottom," etc., are generally used for clarity and convenience in understanding the disclosure and accompanying drawings and do not connote or depend on any specific preference, orientation, or order, except where the context clearly indicates otherwise.

As used herein, the term "and/or" means and includes any and all combinations of one or more of the associated listed items.

As used herein, the terms "high power" and "relatively higher power" as applied to components such as microelectronic devices (e.g., semiconductor dice) are relative and not absolute terms, such terms merely indicating an operational power density which generates heat sufficient to compromise operation or integrity of the device or other devices in the same package, or of the package itself, if not adequately dissipated external to the package. In some instances, while individual components may not exhibit such a power density, multiple devices in combination may generate an undesirable amount of heat requiring remedial measures to dissipate from the package.

Microelectronic device packages may include high power components, such as high power semiconductor dice. In some embodiments, a die stack may include one or more high power dice in the die stack. A high power die or dice may generate an amount of heat detrimental to operation of microelectronic devices of the package. If the heat from the high power die or dice is not sufficiently dissipated, the heat may even cause heat related deformations (e.g., warpage) within the package substrate or even loss of package integrity, causing failure of the microelectronic device package. As microelectronic device packages and the associated devices (e.g., dice) become smaller in form factor, the effects of residual heat may be greater. Thus, efficiently dissipating the heat from high power components may enable the size of the microelectronic devices and packages to be reduced, may enable higher power components or more components to be included in a microelectronic device package, or both.

Some embodiments of the disclosure may include microelectronic device packages including heat conductive (e.g., metal) lids encompassing the microelectronic devices and contacting a package substrate to which the microelectronic devices are mounted. Lidded microelectronic device packages may enable microelectronic devices (e.g., semiconductor dice) enclosed within the lidded microelectronic device package to dissipate heat through the lid, which may act as a heat sink. For example, semiconductor dice in contact with the lid may transmit heat generated by the semiconductor dice to the lid, which may then dissipate the heat through heat transfer to an adjacent component or environment (e.g., heat sink, case, etc.) or fluid (e.g., air, cooling fluid, etc.). However, if a lidded package includes no fill dielectric material between the microelectronic devices and the lid, the trapped air within the package is a poor heat conductor. Similarly, conventional dielectric materials, such as epoxy molding compounds (EMCs) commonly employed to at least partially encompass stacks of microelectronic devices under package lids, are thermal insulators.

Increasing the efficiency of the heat transfer between the microelectronic devices and the lid may reduce failures of lidded microelectronic device packages due to overheating, may allow for higher powered semiconductor dice and/or smaller microelectronic devices and packages, or both.

FIG. 1 illustrates a schematic cross section of an example lidded package 100. The lidded package 100 may include a lid 102 of a thermally conductive (e.g., metal) material covering a die stack 104. The die stack 104 may be fabricated over a substrate 112. In some embodiments, the substrate 112 may be configured to electrically couple the die stack 104 through conductive traces of the substrate (not shown) to one or more conductive elements 108 (e.g., solder bumps) on an opposite side of the substrate 112 from the die stack 104. The conductive elements 108 may be configured to allow the lidded package 100 to be electrically coupled to an adjacent component, such as an adjacent microelectronic device package, a circuit board, etc.

The lid 102 may be secured to the substrate 112 with an adhesive layer 116 (e.g., epoxy, glue, etc.). In some embodiments, the adhesive layer 116 may form a seal between the lid 102 and the substrate 112. For example, the adhesive layer 116 may include silicones, polysulphides, polyurethanes, polyimides, polyesters, epoxies, cyanate esters, olefins and sealing glasses.

The die stack 104 may include multiple dice. For example, the die stack 104 may include a bottom die 114, a top die 106, and one or more intermediate dice 110. One or more of the dice 110, 106, 114 in the die stack 104 may be a die that generates a significant amount of heat, such as a high power die, for example, in the form of a logic die, microprocessor die, graphics processor unit (GPU) die, application specific integrated circuit (ASIC) die, field programmable gate array (FPGA) die.

The die stack 104 may be substantially encapsulated on sides thereof by a side fill dielectric material 118 and a top fill dielectric material 120. In some embodiments, the top fill dielectric material 120 may include a thermal interface material (TIM). The TIM material may be formulated to enhance heat transfer from the die stack 104 to the underside of lid 102 fill dielectric. In some embodiments, the side fill dielectric material 118 may be formulated as an epoxy molding compound (EMC). The EMC, when cured may help secure the dice 110, 106, 114 in the die stack 104 and provide environmental protection. In some instances, the side fill dielectric material 118 impede transfer between the die stack 104 and the lid 102 where the side fill dielectric material 118 extends between the die stack 104 and the lid 102. The general practice of applying the side fill dielectric material 118 before securing the lid 102 may result in voids 124 defined between the lid 102 and the side fill dielectric material 118. The voids 124 may be substantially full of a fluid, such as air or an inert gas, which gas may also act as an insulator substantially restricting heat transfer between the side fill dielectric material 118 and the lid 102 across the void 124.

As illustrated in FIG. 1, the general practice of applying the side fill dielectric material 118, such as an EMC material, and the top fill dielectric material 120, such as a TIM material, to the die stack 104 before securing the lid 102 may also result in voids 122 (e.g., air pockets) within the top fill dielectric material 120. The voids 122 in the top fill dielectric material 120 may reduce the contact surface area of the top fill dielectric material 120 between the top of the die stack 104 and the underside of lid 102, compromising efficiency of the heat transfer through top fill dielectric material 120. The reduced efficiency may result in excess heat remaining in the die stack 104 that may cause premature failure of the lidded package 100.

Figure 2:
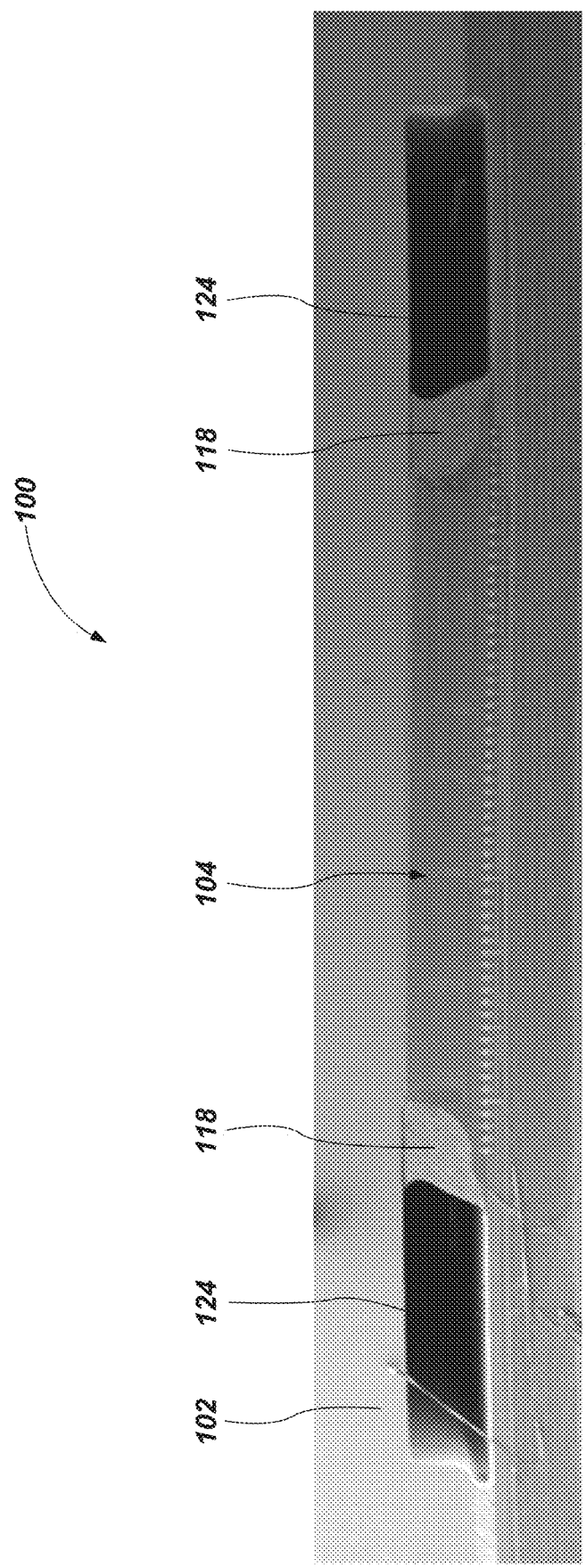
FIGS. 2 and 3 illustrate a photomicrograph images of portions of an interior of an actual lidded package generally corresponding to the schematic of FIG. 1.
Figure 3:
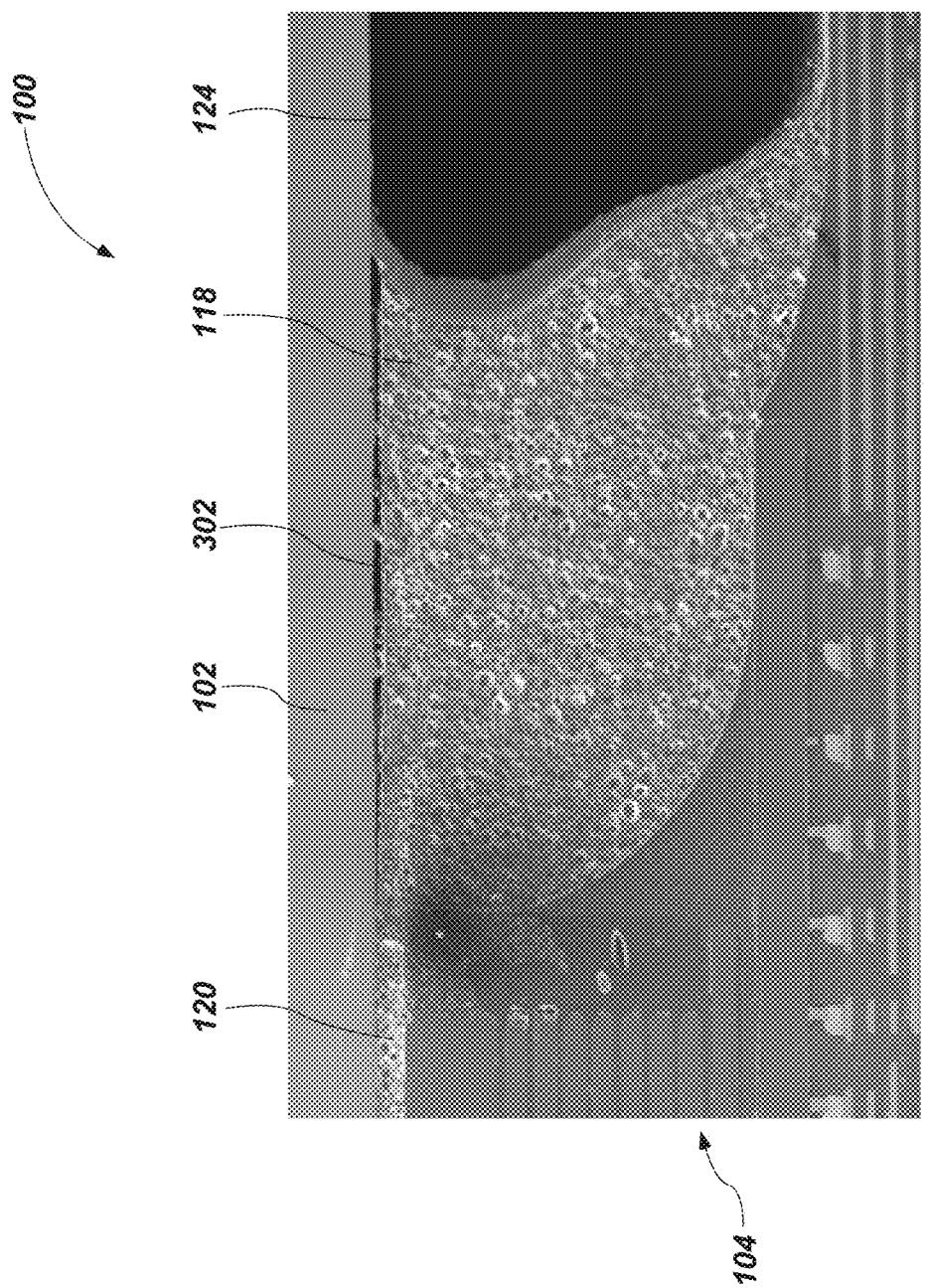

FIGS. 2 and 3 illustrate photomicrographs of an actual lidded package generally corresponding to the schematic example lidded package 100, wherein like components and material are identified by the same reference numerals. The die stack 104 may be encompassed on the sides by the side fill dielectric material 118 and the side fill dielectric material 118 may define voids 124 between the side fill dielectric material 118 and the lid 102. When the side fill dielectric material 118 and the top fill dielectric material 120 are cured a delamination 302 may result between the lid 102 and the side fill dielectric material 118 and/or top fill dielectric material 120. The delamination 302 may be a gap or void defined between the lid 102 and the side fill dielectric material 118 and/or top fill dielectric material 120. The delamination 302 may fill with a gas, such as air that may act as an insulator substantially restricting heat transfer to the lid 102 from the side fill dielectric material 118 and/or the top fill dielectric material 120.

In some instances, the delamination 302 may affect structural integrity of the side fill dielectric material 118. For example, the side fill dielectric material 118 may be configured to provide structural support to the die stack 104. The delamination 302 may substantially weaken a point of support between the side fill dielectric material 118 and the lid 102, such that lateral support provided by the side fill dielectric material 118 to the die stack 104 may be weakened.

Embodiments of the present disclosure may reduce delaminations or voids formed between the lid 102 and the side fill dielectric material 118, the top fill dielectric material 120, or both. Embodiments of the present disclosure may increase the efficiency of heat transfer between the die stack 104 and the lid 102 and/or reduce imperfections, such as voids or delaminations that may restrict the heat transfer and compromise package integrity. Thus, embodiments of the present disclosure may enable the die stacks in lidded packages to operate at lower temperatures, which may increase the reliability and/or life span of the lidded package. In some embodiments, the die stack may be able to support higher powered dice and/or more high power dice.

Embodiments of the present disclosure may include multiple microelectronic devices. The microelectronic devices of the package may be configured as one or more semiconductor dice over a substrate. The microelectronic device may further include a lid extending over the one or more semiconductor dice, enclosing the one or more semiconductor dice between the lid and the substrate and defining a volume between the one or more semiconductor dice and the lid. The lid may include at least one fill aperture and at least one vent aperture. The microelectronic device package may further include at least one fill dielectric material substantially filling the volume between the one or more semiconductor dice and the lid.

Other embodiments of the present disclosure may include a lidded microelectronic device package. The lidded microelectronic device package may include a die stack electrically coupled to a substrate. The lidded microelectronic device package may further include a lid coupled to the substrate, the lid defining a volume over and around the die stack. The lidded microelectronic device package may further include a thermally conductive fill dielectric material substantially filling the volume.

Figure 4:
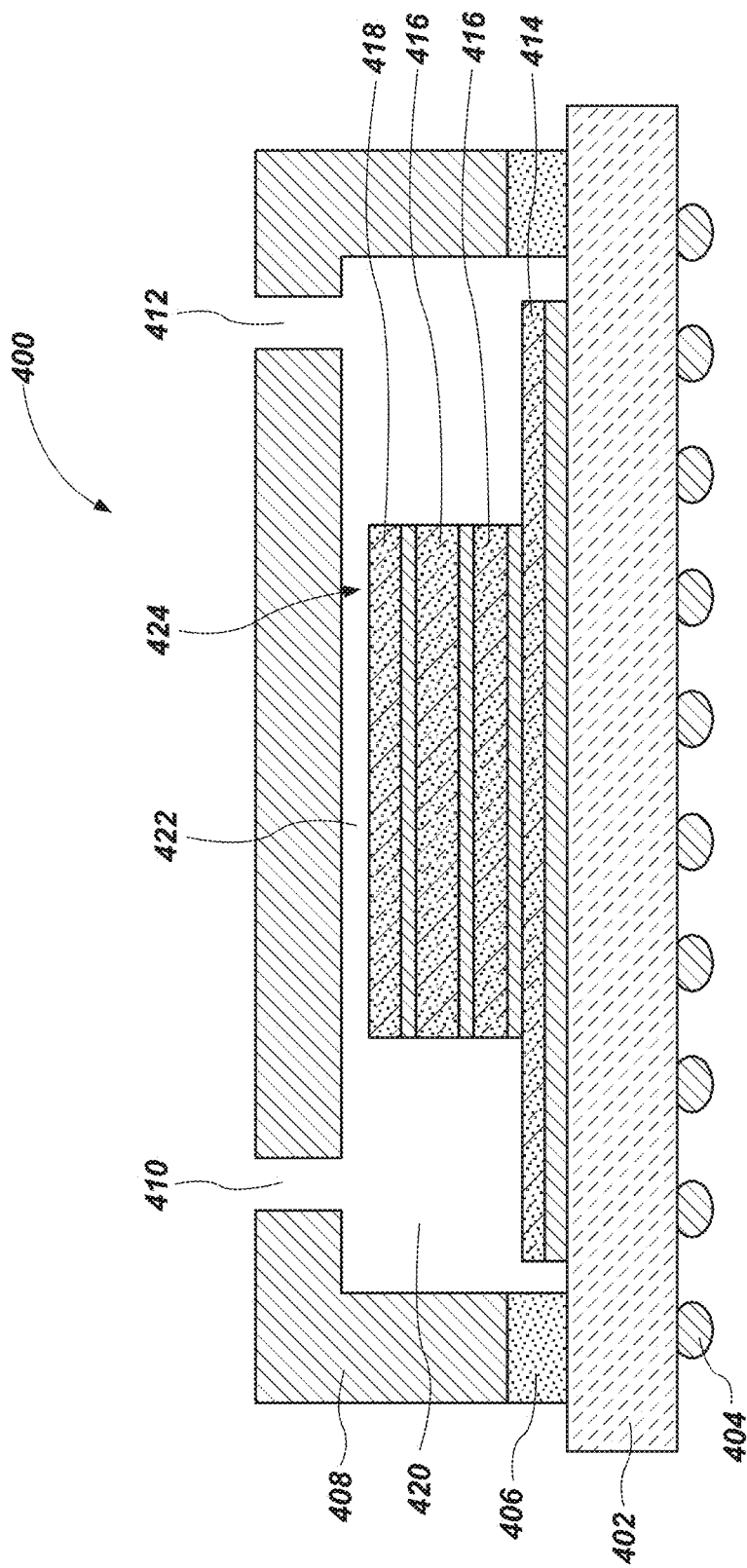
FIG. 4 illustrates a cross-sectional view of a lidded package in accordance with an embodiment of the present disclosure.

FIG. 4 illustrates an embodiment of a lidded package 400 according to an embodiment of the present disclosure. The lidded package 400 may include a die stack 424 electrically coupled to a substrate 402. The die stack 424 may be electrically coupled to one or more conductive elements 404 (e.g., solder bumps) through conductive traces of the substrate 402. The one or more conductive elements 404 may be configured to enable the lidded package 400 to be electrically coupled to an adjacent component, such as another microelectronic device package (e.g., semiconductor device package, etc.), circuit board, etc.

The die stack 424 may include multiple dice, such as a bottom die 414, a top die 418, and one or more intermediate dice 416. One or more of the dice 416, 414, 418 may be configured to function in a manner that generates significant amounts of heat, such as a high power die. For example, the bottom die 414 may be a high power die that may generate significant amounts of heat. In some embodiments, the top die 418 may be a high power die that may generate significant amounts of heat. In some embodiments, one or more of the intermediate dice 416 may be a high power die. Dissipating the heat generated by the individual dice 416, 414, 418 of the die stack 424 may substantially reduce harmful effects of the heat on adjoining dice 416, 414, 418 in the die stack 424. For example, efficiently dissipating the heat generated by a high power die may enable the high power die to be efficiently positioned proximate another die, such as a memory die in the die stack 424. In some embodiments, one or more of the intermediate dice 416 may be a high power die, such that the high power die may be arranged between two other dice 416, 414, 418.

The die stack 424 may be substantially encompassed by a lid 408. The lid 408 may be configured to substantially enclose the die stack 424 between the lid 408 and the substrate 402. The lid 408 may be secured to the substrate 402 through an adhesive layer 406. In some embodiments, the adhesive layer 406 may form a seal between the lid 408 and the substrate 402. For example, the adhesive layer 406 may include silicones, polysulphides, polyurethanes, polyimides, polyesters, epoxides, cyanate esters, olefins and sealing glasses. The adhesive layer 406 may be configured to substantially prevent materials, such as fluids, dust, etc., from entering and/or exiting the space enclosed by the lid 408.

The lid 408 may define a side void 420 between the lid 408 and side surfaces of the die stack 424. The lid 408 may also define a top void 422 between a top surface of the top die 418 and the lid 408. The lid 408 may include a first aperture 410 and a second aperture 412 arranged on opposite sides of the die stack 424. For example, the first aperture 410 may provide a pathway through the lid 408 to the side void 420 on a first side of the die stack 424 and the second aperture 412 may provide a pathway through the lid 408 to the side void 420 on a second side of the die stack 424.

Figure 5:
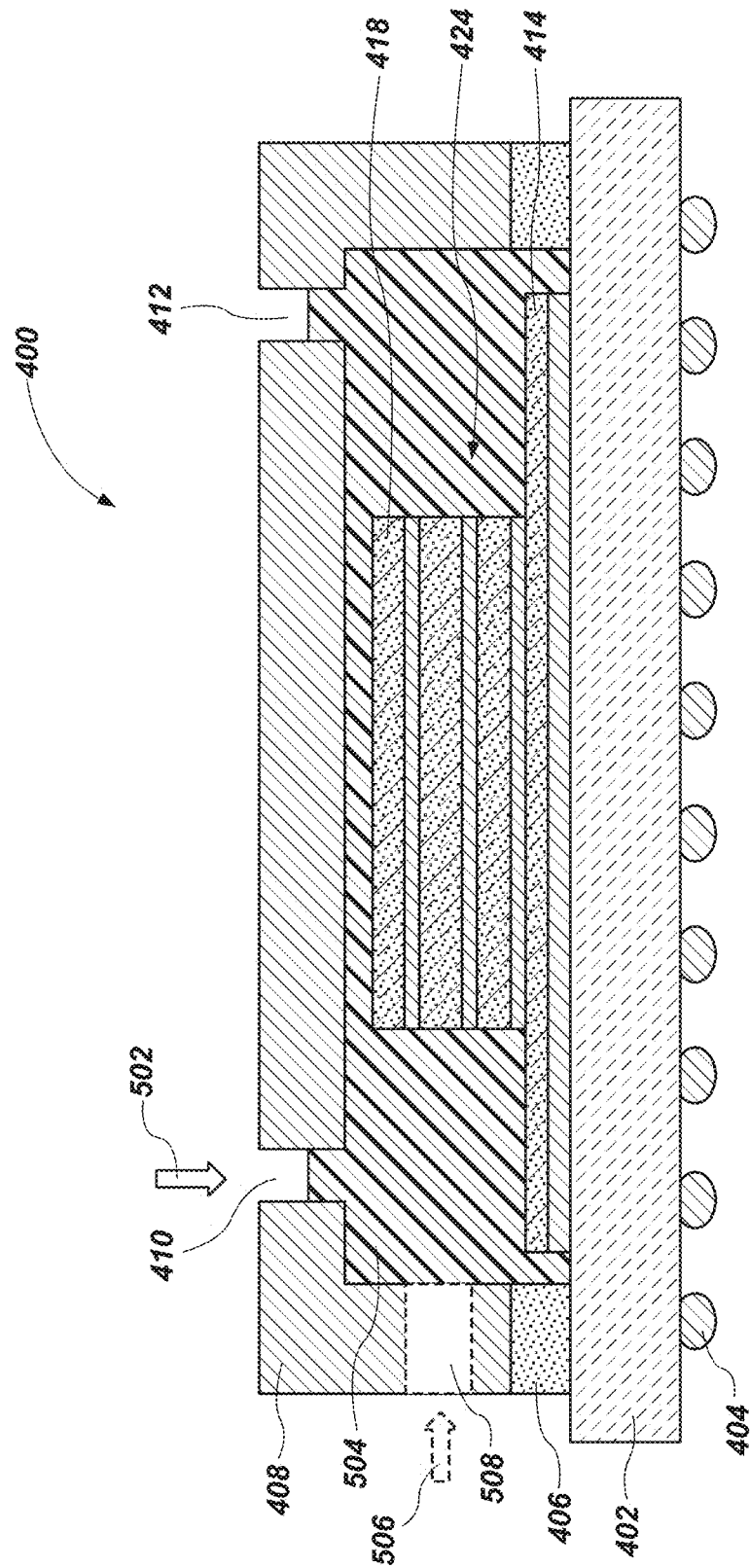
FIG. 5 illustrates a cross-sectional view of the lidded package of FIG. 4 in accordance with an embodiment of the present disclosure.

FIG. 5 illustrates the lidded package 400 during a filling process. A fill dielectric material 504 may be inserted into the lidded package 400 at a fill location 502 after the lid 408 is secured to the substrate 402. For example, the fill location 502 may be configured to insert the fill dielectric material 504 through the first aperture 410. The fill dielectric material 504 may travel from the first aperture 410 over and around the die stack 424 to substantially fill the side void 420 on the first side of the die stack 424 and the side void 420 on the second side of the die stack 424 and other side voids 420 (not shown) around the die stack extending between side voids 420 through which the fill dielectric material 504 flows. The fill dielectric material 504 may also substantially fill the top void 422 between the top die 418 and the lid 408. The air and other fluids that may be present in the side voids 420 and the top void 422 may be displaced by the fill dielectric material 504 to exit the lidded package 400 through the second aperture 412, such that the fill dielectric material 504 may replace the air and other fluids in the side voids 420 and the top void 422.

In some embodiments, the fill dielectric material 504 may be inserted into the lidded package 400 through a side of the lid 408. For example, the fill dielectric material 504 may be inserted at fill location 506 (indicated in broken lines). The fill location 506 may be configured to insert the fill dielectric material 504 through a side aperture 508 (shown in broken lines) defined in a side of the lid 408. In some embodiments, the side aperture 508 may replace the first aperture 410 such that the lid 408 may be substantially solid in the region defining the first aperture 410. The fill dielectric material 504 may substantially fill the side voids 420 and the top void 422 before arriving at the second aperture 412. As described above, the fill dielectric material 504 may substantially displace (e.g., expel, force out, etc.) any air and/or other fluids present in the side voids 420 and/or the top void 422, such that the air and/or other fluids may exit through the second aperture 412 ahead of the fill dielectric material 504.

In some embodiments, the fill dielectric material 504 may be inserted in to the lidded package 400 through the side aperture 508 at the fill location 506 and the lid 408 may include both the first aperture 410 and the second aperture 412. The fill dielectric material 504 may substantially fill the side voids 420 and the top void 422. As described above, the fill dielectric material 504 may substantially displace any air and/or other fluids present in the side voids 420 and/or the top void 422, such that the air and/or other fluids may exit through the first aperture 410 and the second aperture 412 ahead of the displacing fill dielectric material 504.

In some embodiments, the fill dielectric material 504 may be inserted through a pressure injection process. For example, the fill dielectric material 504 may be pressurized in a reservoir (e.g., tank, pressure vessel, cylinder, etc.) to a pressure higher than a pressure in the side voids 420 and the top void 422. In some embodiments, the fill dielectric material 504 may be pressurized by a pump (e.g., centrifugal pump, reciprocating pump, piston and cylinder, etc.), a compressor (e.g., reciprocal compressor, scroll compressor, etc.), or an applied external pressure. The pressurized fill dielectric material 504 may be coupled to the first aperture 410 through a hose, nozzle, coupler, etc. The higher pressure fill dielectric material 504 may displace the air and/or other fluids and materials present in the side voids 420 and the top void 422, such that the air and/or other fluids and materials are forced out of the side voids 420 and top void 422 under the pressure of the higher pressure fill dielectric material 504.

In some embodiments, the fill dielectric material 504 may be drawn through the first aperture 410 by reducing a pressure in the side voids 420 and the top void 422 within the lidded package 400 such that the pressure difference between the fill dielectric material 504 and the side voids 420 and/or the top void 422 may draw the fill dielectric material 504 from a reservoir into the side voids 420 and the top void 422 through the first aperture 410. For example, the pressure in the side voids 420 and the top void 422 may be reduced through a suction or vacuum process. The suction or vacuum may be configured to draw the air and/or other fluids from one of the first aperture 410 and the second aperture 412 such that the fill dielectric material 504 may be drawn into the other of the first aperture 410 and the second aperture 412.

In some embodiments, the fill dielectric material 504 may be drawn through the first aperture 410 by a capillary action. For example, the first aperture 410 may be sufficiently small and the fill dielectric material 504 may have material properties (e.g., wettability, surface tension, etc.) configured to enable the cohesion forces within the fill dielectric material 504 and the adhesion forces between the fill dielectric material 504 and the lid 408, the die stack 424, and/or the substrate 402 to propel the fill dielectric material 504 through the first aperture 410 and around the die stack 424, substantially filling the side voids 420 and the top void 422.

The fill dielectric material 504 may be a material having a relatively low viscosity. For example, the fill dielectric material 504 may have a viscosity of less than about 600 Pascal seconds (Ps), such as less than about 100 Ps or less than about 20 Ps. A low viscosity may enable the fill dielectric material 504 to flow through the first aperture 410 and small passages defined between the die stack 424 and the lid 408. Low viscosities of the fill dielectric material 504 may allow the fill dielectric material 504 to substantially fill the side voids 420 and the top void 422 with lower pressure differences between the fill dielectric material 504 and the side voids 420 and/or top void 422. In some embodiments, low viscosities of the fill dielectric material 504 may enable the process of filling the side voids 420 and the top void 422 with the fill dielectric material 504 to be completed in less time.

In some embodiments, the fill dielectric material 504 may be a thermally conductive material. For example, the fill dielectric material 504 may be a Thermal Interface Material (TIM). A TIM may be a composite material including thermally conductive filler materials, such as aluminum oxide, magnesium oxide, aluminum nitride, boron nitride, and diamond powder. The TIM may exhibit a high thermal conductivity, such as a thermal conductivity of greater than about 5 Watts/meter Kelvin (W/mK), greater than about 10 W/mK, or greater than about 15 W/mK. In some embodiments, the fill dielectric material 504 may be an Epoxy Molding Compound (EMC), such as a high-k EMC. A high-k EMC may have a thermal conductivity of greater than about 2 W/mK, such as greater than about 4 W/mK or greater than about 10 W/mK.

Some nonlimiting examples of TIM/EMC materials that may be used as a fill dielectric material include SARCON® SPG-20A sold by Fuji Polymer Industries Co. (DBA FUJIPOLY®) with a principal place of business at 900 Milik Street, Carteret, New Jersey.; KE-G1250FC, KE-G1270M, KE-G1250HT, KE-G1250HT-4 series, KE-G1250HT-U/C/W, KE-G2250HT-U/C/W, and KE-G 300 series sold by KYOCERA® North America, Kyocera Corporation with a principal place of business at 8611 Balboa Ave., San Diego California; and EME-A760G sold by Sumitomo Bakelite Co LTD with a principal place of business at 46820 Magellan Drive Suite C, Novi, Michigan.

Figure 6:
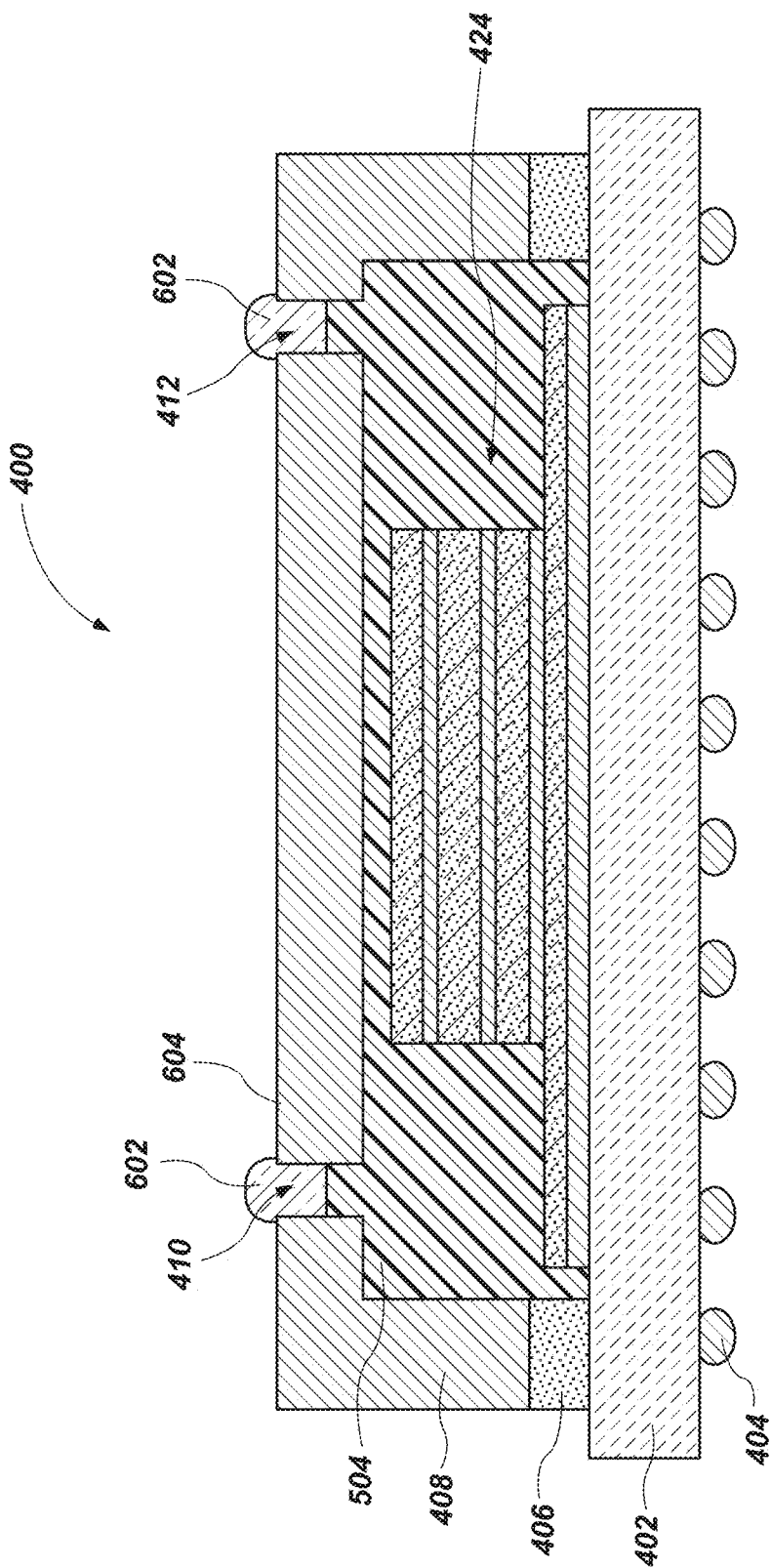
FIG. 6 illustrates a cross-sectional view of the lidded package of FIGS. 4 and 5 in accordance with an embodiment of the present disclosure.

FIG. 6 illustrates the lidded package 400 after the filling process is completed. After the filling process the fill dielectric material 504 may substantially fill the side voids 420 and the top void 422. For example, all air and/or fluids and materials other than the fill dielectric material 504 may be substantially removed from the side voids 420 and the top void 422, such that the fill dielectric material 504 may substantially physically and thermally couple the die stack 424 to the lid 408. As described above, the lid 408 may be configured to act as a heat sink. For example, the lid 408 may be formed from a highly thermally conductive material, such as a metallic material (e.g., copper, aluminum, etc.). In some embodiments, the die stack 424 may be structurally supported by the lid 408 through the fill dielectric material 504.

The first aperture 410 and the second aperture 412 may be sealed by respective plugs 602. In some embodiments, the plugs 602 may be formed by the fill dielectric material 504. For example, the fill dielectric material 504 may be cured in a curing process, such as a heating process or a chemical reaction process. The curing process may cause the fill dielectric material 504 to harden. The hardened fill dielectric material 504 may substantially seal the first aperture 410 and the second aperture 412 such that no material may enter or exit the lidded package 400 through the first aperture 410 or the second aperture 412.

In some embodiments, the fill dielectric material 504 may be inserted into the lidded package 400 during the filling process until a portion of the fill dielectric material 504 begins to exit the lid 408 through the second aperture 412 and/or the first aperture 410. The fill dielectric material 504 may then be cured such that the fill dielectric material 504 hardens leaving a hardened portion of the fill dielectric material 504 exposed above a top surface 604 of the lid 408 at the first aperture 410 and the second aperture 412. The exposed portion of the fill dielectric material 504 may be a top portion of the plugs 602. In some embodiments, the exposed portion of the plugs 602 may then be removed through a material removal process such as a polishing process, a grinding process, or a wet etching process, such that the top surface 604 of the lid 408 is rendered substantially planar through the region including the first aperture 410 and the second aperture 412 to lower the profile of lidded semiconductor device package 400, highly desirable for mobile device applications.

In some embodiments, the plugs 602 may be formed from a different material from the fill dielectric material 504. For example, the plugs 602 may be formed from a material that may solidify before the curing process, such as a chemically activated epoxy or resin, a solder material, etc. For example, the filling process may stop the fill dielectric material 504 before the fill dielectric material 504 exits through the first aperture 410 or the second aperture 412, such that a space remains between a top surface of the fill dielectric material 504 and the top surface 604 of the lid 408. The second material may then be inserted into the first aperture 410 and the second aperture 412 while the fill dielectric material 504 remains in a liquid state. In some embodiments, the second material may harden forming the plugs 602 while the fill dielectric material 504 remains in the liquid state. The lidded package 400 may then go through a curing process to cure the fill dielectric material 504 into a hardened or solid state. Expansion or contraction of the fill dielectric material 504 during the curing process may cause the plugs 602 to extend out of the first aperture 410 and the second aperture 412 or retract into the first aperture 410 and the second aperture 412. Any exposed portion of the plugs 602 may then be removed in a material removal process such as grinding, polishing, or wet etching.

In some embodiments the plug 602 may be formed from a different material from the fill dielectric material 504 after the curing process. For example, at least a portion of the first aperture 410 and the second aperture 412 may remain free from the fill dielectric material 504 after the filling and curing processes. A second material may be flowed into the first aperture 410 and the second aperture 412 after the curing process to substantially fill the first aperture 410 and the second aperture 412. In some embodiments, the second material of the plugs 602 may be configured to chemically cure, such as an epoxy mixed with an activator that causes a chemical reaction resulting in curing the second material of the plugs 602. In some embodiments, the lidded package 400 may go through a second curing process after the plug 602 is flowed into the first aperture 410 and the second aperture 412.

Figure 7:
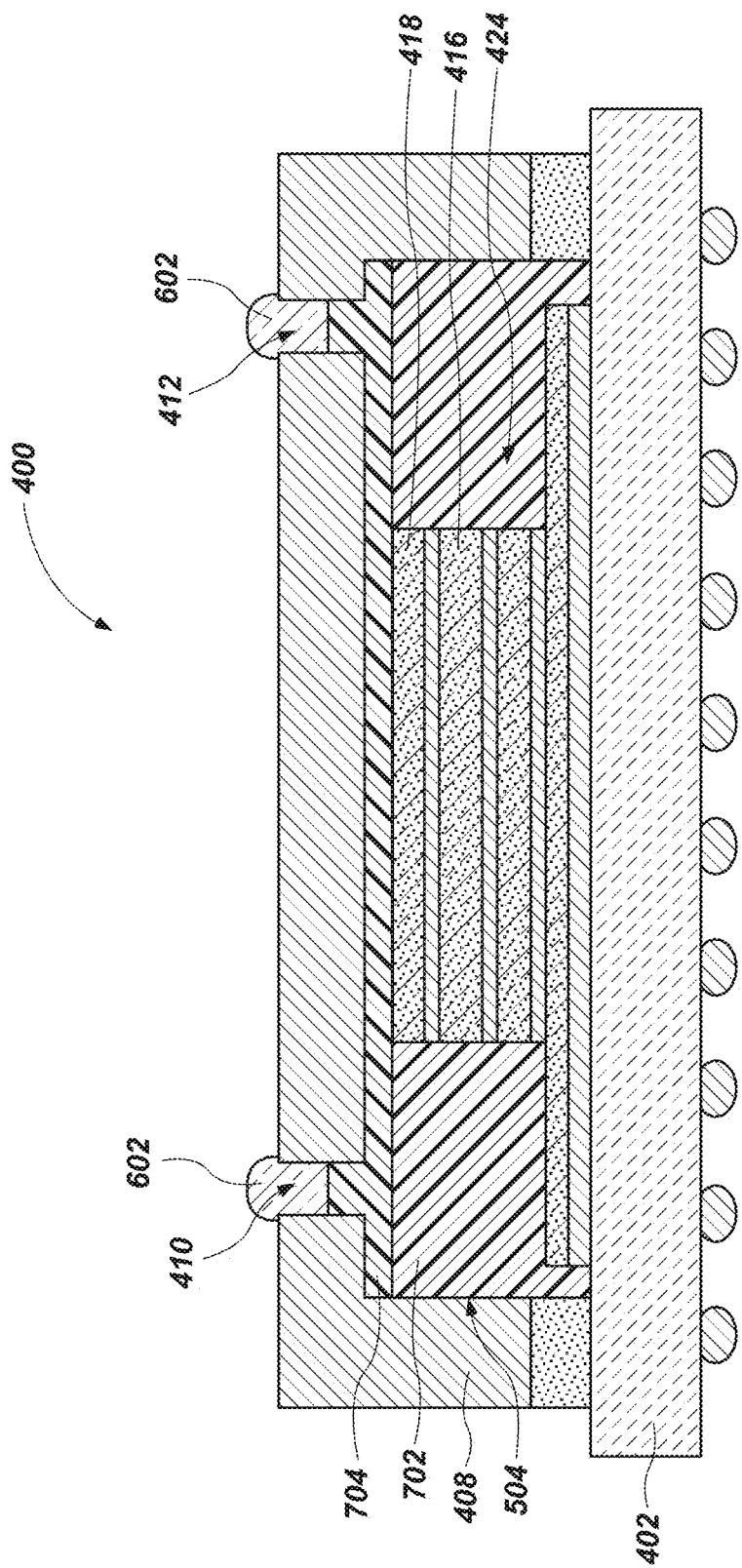
FIG. 7 illustrates a cross-sectional view of the lidded package of FIGS. 4 and 5 in accordance with an embodiment of the present disclosure.

FIG. 7 illustrates an embodiment of the lidded package 400. In some embodiments, the fill dielectric material 504 may include more than one fill dielectric material. For example, during the filling process a first fill dielectric material 702 may be flowed into the side voids 420. In some embodiments, the first fill dielectric material 702 may be flowed in a metered fashion into the side voids 420 until the first fill dielectric material 702 is at substantially a same level as the top die 418. For example, the first fill dielectric material 702 may be flowed into the side voids 420 until a top surface of the first fill dielectric material 702 is at substantially the same level as a top surface of the top die 418 as illustrated in FIG. 7. In some embodiments, the first fill dielectric material 702 may be flowed into the side void 420 until the top surface of the first fill dielectric material 702 is at substantially the same level as a bottom surface of the top die 418 (e.g., the point where the top die 418 is coupled to an adjacent die 416 of the die stack 424). In some embodiments, the first fill dielectric material 702 may be flowed into the side voids 420 until the top surface of the first fill dielectric material 702 reaches a bottom surface of a high power die of the die stack 424.

A second fill dielectric material 704 may then be flowed into the remaining space in the side voids 420 and the top void 422 above the first fill dielectric material 702. In some embodiments, the first fill dielectric material 702 and the second fill dielectric material 704 may have different material properties, such as different thermal conductivities, different viscosities, different structural properties, etc. In some embodiments, the first fill dielectric material 702 and the second fill dielectric material 704 may have different costs, such as different material costs, different process costs (e.g., time to fill, cure time, etc.). For example, the first fill dielectric material 702 may be a material having a relatively lower thermal conductivity and that has lower associated costs. The relatively lower thermal conductivity may be sufficient for dissipating heat from the low powered dice in the die stack 424. If the high power dice in the die stack 424 is the top die 418, the lower cost first fill dielectric material 702 may be used to fill a majority of the side voids 420 and a higher cost higher thermal conductivity second fill dielectric material 704 may only be used to fill the top portion of the side voids 420 and the top void 422. Thus, the total costs of the fill dielectric material 504 may be reduced by filling the majority of the lidded package 400 with a lower cost first fill dielectric material 702 while only using a relatively small amount of the higher cost second fill dielectric material 704 in the area of the lidded package 400 where it is necessary.

Figure 8A:
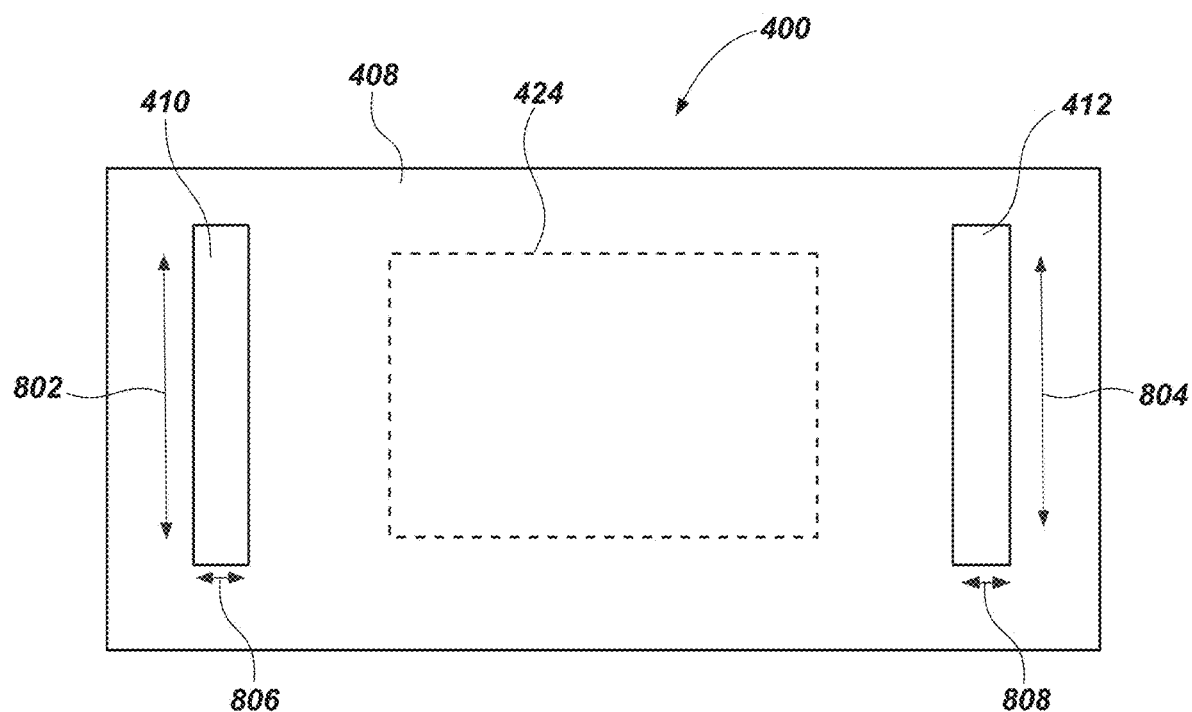
FIGS. 8A and 8B illustrate a top view of the lidded package of FIGS. 4-7 in accordance with an embodiment of the present disclosure.
Figure 8B:
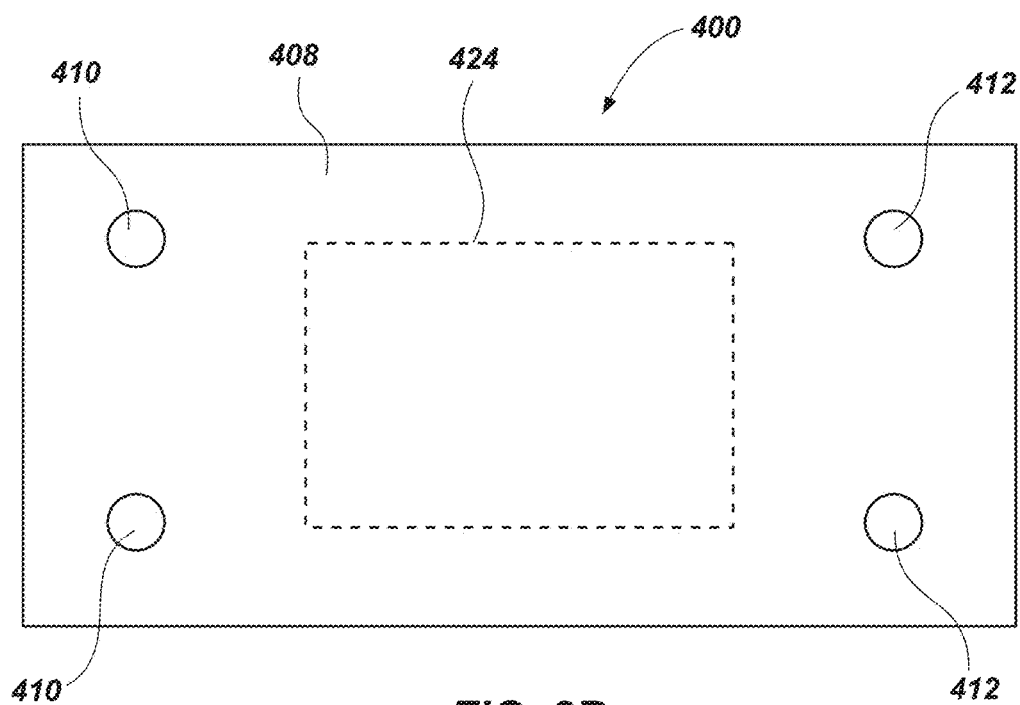

FIGS. 8A and 8B illustrate top views of further variations of the embodiments of the lidded package 400. Referring to FIG. 8A, in some embodiments, the first aperture 410 and/or the second aperture 412 in the lid 408 of the lidded package 400 may be configured as elongated slots. As described above, the first aperture 410 and the second aperture 412 may be arranged on opposite sides of the die stack 424. In some embodiments, the slots of the first aperture 410 and/or the second aperture 412 may be substantially parallel with a side of the die stack 424. In some embodiments, the slots of the first aperture 410 and/or the second aperture 412 may be substantially parallel with side surfaces of the lid 408.

The slot of the first aperture 410 may have a length 802 and the slot of the second aperture 412 may have a length 804. In some embodiments, the length 802 of the first aperture 410 and the length 804 of the second aperture 412 may be substantially the same. In some embodiments, the length 802 of the first aperture 410 may be greater than the length 804 of the second aperture 412. In some embodiments, the length 802 of the first aperture 410 may be less than the length 804 of the second aperture 412.

The slot of the first aperture 410 may have a width 806 and the slot of the second aperture 412 may have a width 808. In some embodiments, the width 806 of the first aperture 410 and the width 808 of the second aperture 412 may be substantially the same. In some embodiments, the width 806 of the first aperture 410 may be greater than the width 808 of the second aperture 412. In some embodiments, the width 806 of the first aperture 410 may be less than the width 808 of the second aperture 412.

The length 802 and width 806 of the first aperture 410 may define an area of the first aperture 410 and the length 804 and the width 808 of the second aperture 412 may define an area of the second aperture 412. As described above, in some embodiments, the area of the first aperture 410 and the second aperture 412 may vary such that in some embodiments the first aperture 410 is larger than the second aperture 412, in some embodiments the first aperture 410 and the second aperture 412 are substantially the same size, and in some embodiments the first aperture 410 is smaller than the second aperture 412. For example, if the fill dielectric material 504 is inserted into the first aperture 410 under pressure the first aperture 410 may be substantially the same size as or smaller than the second aperture 412 such that the air and other fluids exiting through the second aperture 412 may exit without causing a substantial rise in pressure within the lidded package 400. In some embodiments, where a pressure reduction is used to evacuate the air and other fluids from the lidded package 400 through the second aperture 412, the second aperture 412 may be substantially the same size as or a smaller size than the first aperture 410.

In some embodiments, the length 802 of the first aperture 410 and the length 804 of the second aperture 412 may be substantially the same as a length of a parallel side of the die stack 424. In some embodiments, the length 802 and/or the length 804 of the respective first aperture 410 and second aperture 412 may be greater than the length of the parallel side of the die stack 424, such that ends of the first aperture 410 and/or the second aperture 412 extend beyond the sides of the die stack 424.

Referring to FIG. 8B, in some embodiments, the first aperture 410 may be configured as and include one or more small apertures on a first side of the die stack 424 and the second aperture 412 may be configured as and include one or more small apertures on a second opposite side of the die stack 424. In some embodiments, the smaller apertures of the first aperture 410 and/or the second aperture 412 may be substantially circular in shape, as illustrated in FIG. 8B. In some embodiments, the smaller apertures of the first aperture 410 and the second aperture 412 may have other shapes, such as ovals, ellipses, squares, rectangles, triangles, pentagons, hexagons, octagons, etc.

In some embodiments, the first aperture 410 may include substantially the same number of smaller apertures as the second aperture 412. In some embodiments, the first aperture 410 may include a different number of smaller apertures than the second aperture 412. For example, an area of each of the first aperture 410 and the second aperture 412 may be defined by the number of smaller apertures associated with each of the first aperture 410 and the second aperture 412. As described above, some embodiments may be configured such that the smaller apertures of the first aperture 410 are larger than the second aperture 412 or such that the first aperture 410 includes more of the smaller apertures than the second aperture 412. In some embodiments, the area of the first aperture 410 may be substantially the same as the second aperture 412 or the first aperture 410 may include substantially the same number of apertures as the second aperture 412. In some embodiments, the first aperture 410 may be substantially smaller than the second aperture 412 or the first aperture 410 may include fewer apertures than the second aperture 412.

In some embodiments, a size of the smaller apertures of the first aperture 410 may be substantially the same as a size of the smaller apertures of the second aperture 412. For example, a major dimension (e.g., diameter, radius, major axis, length, width, apothem, altitude, etc.) of the smaller apertures of the first aperture 410 may be substantially the same as a major dimension of the smaller apertures of the second aperture 412. In some embodiments, the area of the smaller apertures of the first aperture 410 may be different from the area of the smaller apertures of the second aperture 412. In some embodiments, the area of the first aperture 410 and the area of the second aperture 412 may be defined by the areas and the number of the smaller apertures associated with the first aperture 410 and the second aperture 412.

Figure 9:
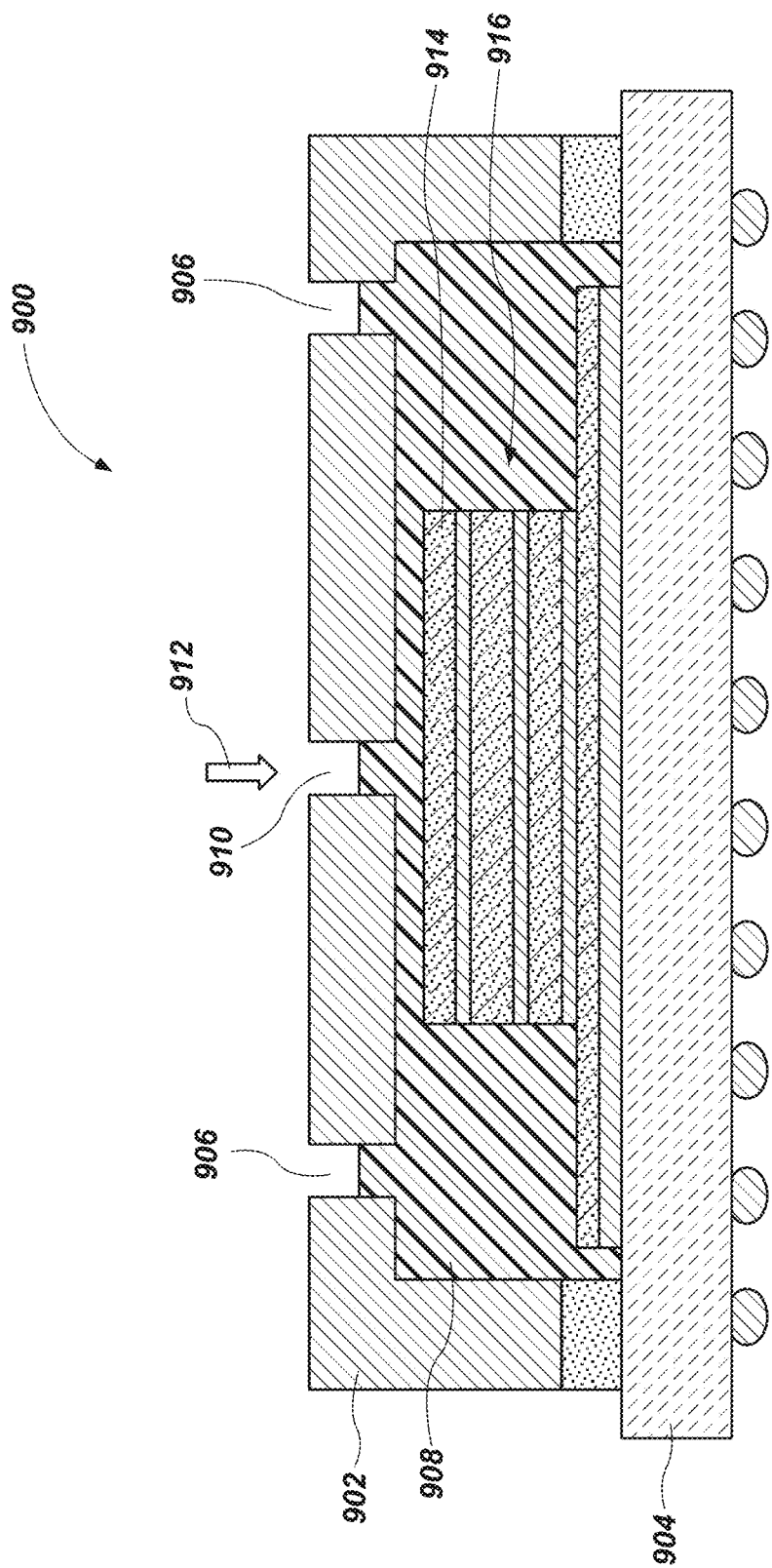
FIG. 9 illustrates a cross-sectional view of a lidded package in accordance with an embodiment of the present disclosure.

FIG. 9 illustrates an embodiment of a lidded package 900 in the fill process. The lidded package 900 may include a lid 902 secured to a substrate 904. The lid 902 may enclose a die stack 916 between the lid 902 and the substrate 904. The lid 902 may include side apertures 906 and a central aperture 910. The side apertures 906 may be positioned on opposite sides of the die stack 916. For example, the side apertures 906 may be positioned in the top of the lid 902 over opposing sides of the die stack 916. The central aperture 910 may be positioned above the die stack 916. For example, the central aperture 910 may be positioned in a region of the lid 902 substantially centered above the die stack 916.

During the fill process the fill dielectric material 908 may be flowed into the lidded package 900 at a fill location 912. The fill location 912 may be positioned adjacent to the central aperture 910, such that the fill dielectric material 908 may flow through the central aperture 910. Air and other fluids or materials in the space defined between the die stack 916 and the lid 902 may be displaced to exit the lidded package 900 through the side apertures 906 by the fill dielectric material 908.

The fill dielectric material 908 may be flowed into the lidded package 900 through processes such as those described above. For example, the fill dielectric material 908 may be pressurized above the pressure within the lidded package 900, the pressure within the lidded package 900 may be reduced to a pressure lower than the pressure of the fill dielectric material 908, and/or the fill dielectric material 908 may flow through the central aperture 910 through a capillary action.

Figure 10:
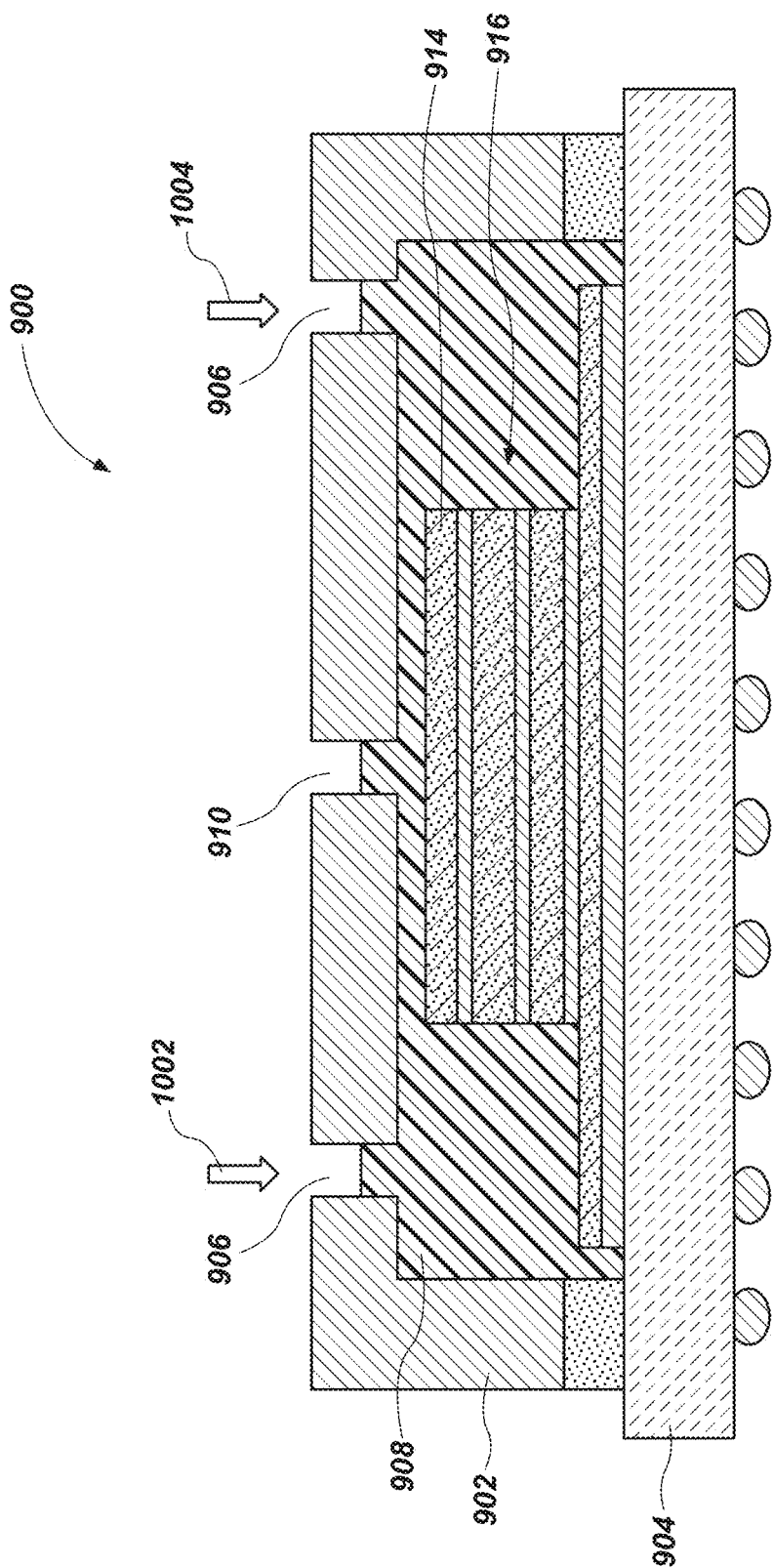
FIG. 10 illustrates a cross-sectional view of the lidded package of FIG. 9 in accordance with an embodiment of the present disclosure.

FIG. 10 illustrates another embodiment of the lidded package 900 during the fill process. In some embodiments, the fill dielectric material 908 may be flowed into the lidded package 900 at a first fill location 1002 and a second fill location 1004. The first fill location 1002 and the second fill location 1004 may be substantially aligned with the side apertures 906, such that the fill dielectric material 908 may flow through the side apertures 906. Air and other fluids or materials in the space defined between the die stack 916 and the lid 902 may exit the lidded package 900 through the central aperture 910 as the air and other fluids or materials are displaced by the fill dielectric material 908.

The fill dielectric material 908 may be flowed into the lidded package 900 through processes such as those described above. For example, the fill dielectric material 908 may be pressurized above the pressure within the lidded package 900, the pressure within the lidded package 900 may be reduced to a pressure lower than the pressure of the fill dielectric material 908, and/or the fill dielectric material 908 may flow through the side apertures 906 through a capillary action.

Figure 11:
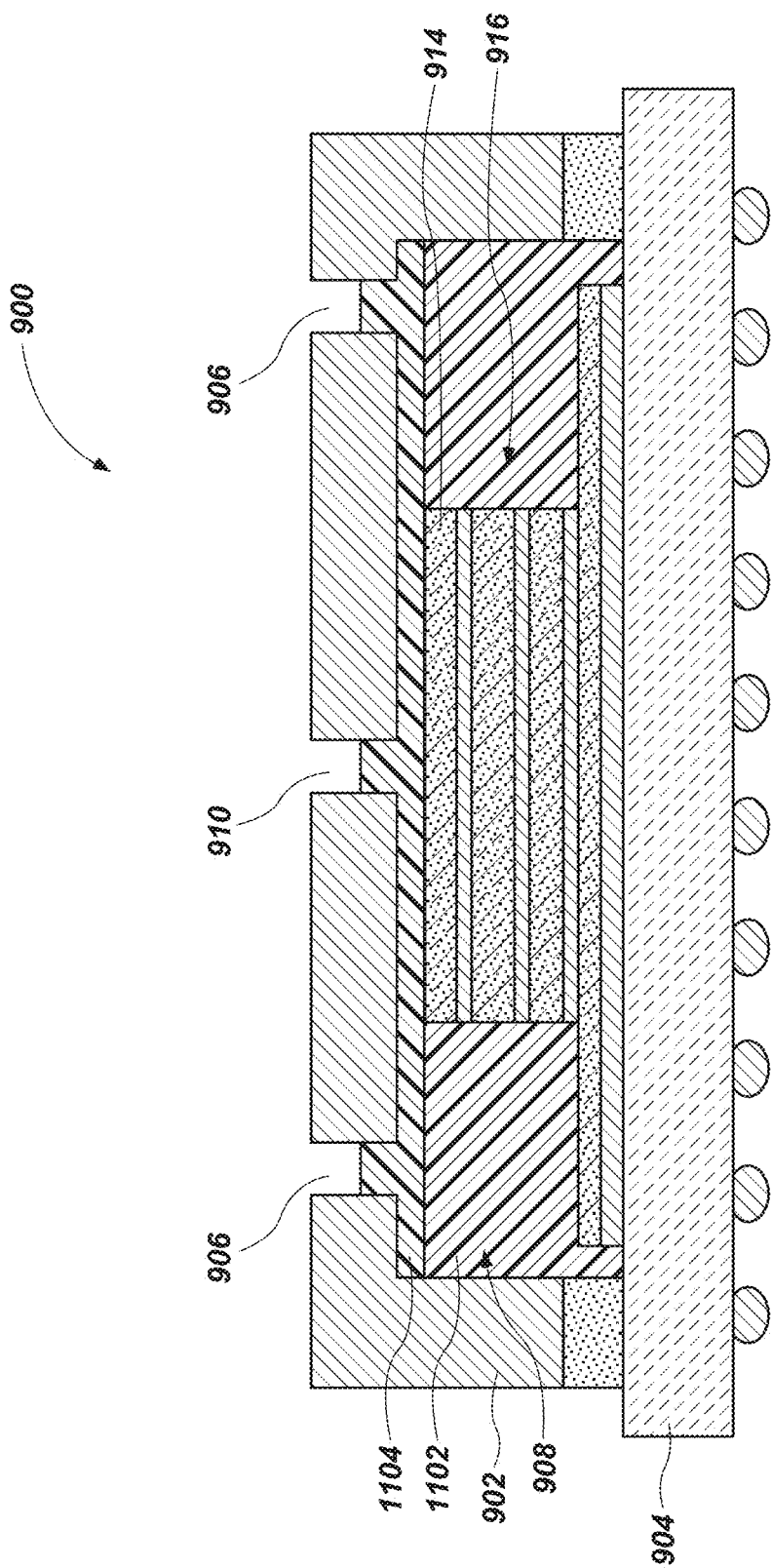
FIG. 11 illustrates a cross-sectional view of the lidded package of FIGS. 9 and 10 in accordance with an embodiment of the present disclosure.

FIG. 11 illustrates an embodiment of the lidded package 900. In some embodiments, the fill dielectric material 908 may include more than one fill dielectric material. For example, during the filling process a first fill dielectric material 1102 may be flowed into the space between the die stack 916 and the lid 902. In some embodiments, the first fill dielectric material 908 may be flowed into the space between the die stack 916 and the lid 902 until the first fill dielectric material 1102 is at substantially a same level as the top die 914. For example, the first fill dielectric material 1102 may be flowed into the space between the die stack 916 and the lid 902 until a top surface of the first fill dielectric material 1102 is at substantially the same level as a top surface of the top die 914 as illustrated in FIG. 11. In some embodiments, the first fill dielectric material 1102 may be flowed into the space between the die stack 916 and the lid 902 until the top surface of the first fill dielectric material 1102 is at substantially the same level as a bottom surface of the top die 914 (e.g., the point where the top die 914 is coupled to an adjacent die of the die stack 916). In some embodiments, the first fill dielectric material 1102 may be flowed into the space between the die stack 916 and the lid 902 until the top surface of the first fill dielectric material 1102 reaches a bottom surface of the high power die of the die stack 916.

A second fill dielectric material 1104 may be flowed into the remaining space in the space between the die stack 916 and the lid 902 above the first fill dielectric material 1102. In some embodiments, the first fill dielectric material 1102 and the second fill dielectric material 1104 may have different material properties, such as different thermal conductivities, different viscosities, different structural properties, etc. In some embodiments, the first fill dielectric material 1102 and the second fill dielectric material 1104 may have different costs, such as different material costs, different process costs (e.g., time to fill, curing time, etc.). For example, the first fill dielectric material 1102 may be a material having a lower thermal conductivity and that has lower associated costs. The lower thermal conductivity may be sufficient for dissipating heat from the low powered dice in the die stack 916. If the high power dice in the die stack 916 is the top die 914, the lower cost first fill dielectric material 1102 may be used to fill dielectric a majority of the space between the die stack 916 and the lid 902 and a higher cost higher thermal conductivity second fill dielectric material 1104 may only be used to fill dielectric the top portion of the space between the die stack 916 and the lid 902. Thus, the total costs of the fill dielectric material 908 may be reduced by filling the majority of the lidded package 900 with a lower cost first fill dielectric material 1102 while only using a relatively small amount of the higher cost second fill dielectric material 1104 in the area of the lidded package 900 where it is necessary.

In some embodiments, different portions of the die stack 916 may benefit from different properties of the fill dielectric material 908. For example, several dice in the die stack 916 may not generate large amounts of heat, however, the same dice may require support to maintain operable connections with one or more adjacent dice of the die stack 916. A top die 914 of the die stack 916 may produce high amounts of heat but not need the same amount of support. The first fill dielectric material 1102 may be configured to provide greater amounts of support (e.g., may be a rigid material) but may have a relatively lower thermal conductivity whereas the second fill dielectric material 1104 may have a relatively higher thermal conductivity and may have lower rigidity.

Figure 12A:
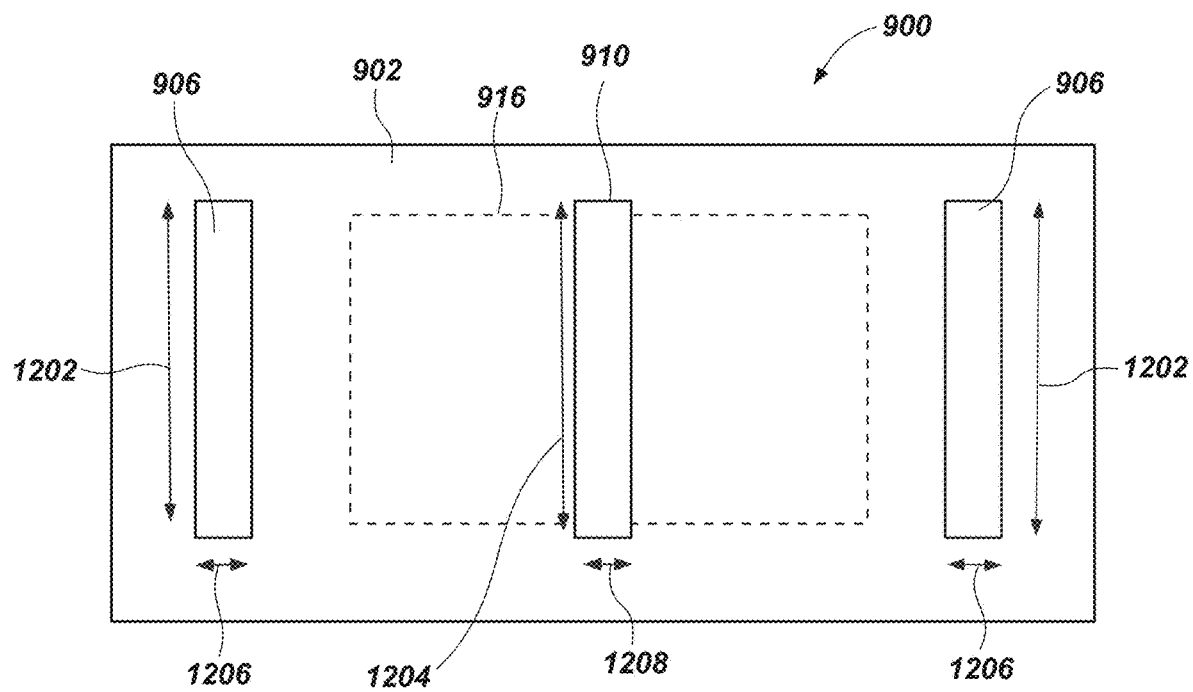
FIGS. 12A and 12B illustrate a top view of the lidded package of FIGS. 9-11 in accordance with an embodiment of the present disclosure.
Figure 12B:
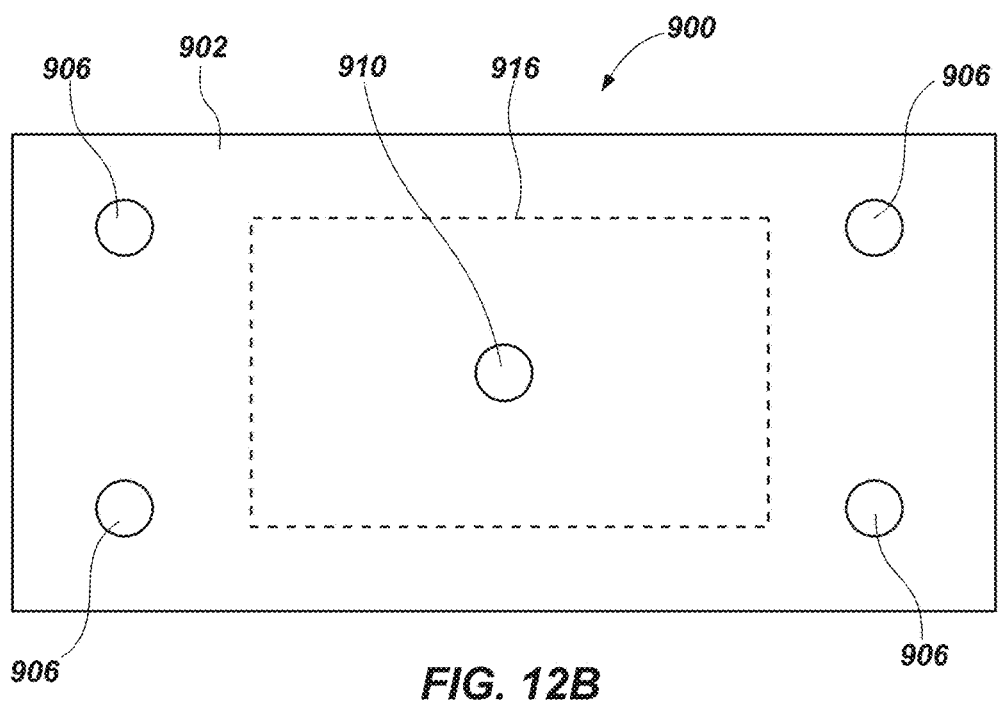

FIGS. 12A and 12B illustrate top views of embodiments of the lidded package 900. Referring to FIG. 12A, in some embodiments, the side apertures 906 and/or the central aperture 910 in the lid 902 of the lidded package 900 may be configured as elongated slots. As described above, the side apertures 906 and the central aperture 910 may be arranged on opposite sides of the die stack 916. In some embodiments, the slots of the side apertures 906 and/or the central aperture 910 may be substantially parallel with a side of the die stack 916. In some embodiments, the slots of the side apertures 906 and/or the central aperture 910 may be substantially parallel with side surfaces of the lid 902.

The slots of the side apertures 906 may have a length 1202 and the slot of the central aperture 910 may have a length 1204. In some embodiments, the length 1202 of the side apertures 906 and the length 1204 of the central aperture 910 may be substantially the same. In some embodiments, the length 1202 of the side apertures 906 may be greater than the length 1204 of the central aperture 910. In some embodiments, the length 1202 of the side apertures 906 may be less than the length 1204 of the central aperture 910.

The slots of the side apertures 906 may have a width 1206 and the slot of the central aperture 910 may have a width 1208. In some embodiments, the width 1206 of the side aperture 906 and the width 1208 of the central aperture 910 may be substantially the same. In some embodiments, the width 1206 of the side apertures 906 may be greater than the width 1208 of the central aperture 910. In some embodiments, the width 1206 of the side apertures 906 may be less than the width 1208 of the central aperture 910.

The length 1202 and width 1206 of the side apertures 906 may define an area of the side apertures 906 and the length 1204 and the width 1208 of the central aperture 910 may define a size of the central aperture 910. As described above, in some embodiments, the areas of the side apertures 906 and the central aperture 910 may vary such that in some embodiments the side apertures 906 are larger than the central aperture 910, in some embodiments the side apertures 906 and the central aperture 910 are of substantially the same area, and in some embodiments the areas of side apertures 906 are smaller than the central aperture 910.

In some embodiments, the length 1202 of the side apertures 906 and the length 1204 of the central aperture 910 may be substantially the same as a length of a parallel side of the die stack 916. In some embodiments, the length 1202 and/or the length 1204 of the respective side apertures 906 and central aperture 910 may be greater than the length of the parallel side of the die stack 916, such that ends of the side apertures 906 and/or the central aperture 910 extend beyond the sides of the die stack 916.

Referring to FIG. 12B, in some embodiments, the side apertures 906 and/or the central aperture 910 may be configured as and include one or more smaller apertures arranged around the die stack 916. In some embodiments, the smaller apertures of the side apertures 906 and/or the central aperture 910 may be substantially circular in shape, as illustrated in FIG. 8B. In some embodiments, the smaller apertures of the side apertures 906 and/or the central aperture 910 may have other shapes, such as ovals, ellipses, squares, rectangles, triangles, pentagons, hexagons, octagons, etc.

In some embodiments, the central aperture 910 may only include a single aperture and the side apertures 906 may include multiple apertures arranged about the die stack 916. For example, the side apertures 906 may include multiple equally spaced apertures arranged about the die stack 916. In some embodiments, the side apertures 906 may include multiple apertures aligned substantially parallel with a side of the die stack 916.

In some embodiments, an area of the smaller apertures of the side apertures 906 may be substantially the same as an area of the aperture(s) of the central aperture 910. For example, a major dimension (e.g., diameter, radius, major axis, length, width, apothem, altitude, etc.) of the smaller apertures of the side apertures 906 may be substantially the same as a major dimension of the aperture(s) of the central aperture 910. In some embodiments, the area of the apertures of the side apertures 906 may be different from the area of the aperture(s) of the central aperture 910. In some embodiments, the area of the side apertures 906 and the area of the central aperture 910 may be defined by the area and the number of the smaller apertures associated with the side apertures 906 and the central aperture 910.

In all of the foregoing embodiments, the area, shape and placement of the various apertures employed to introduce fill dielectric material into an interior of a lidded microelectronic device package of the disclosure may be adjusted and tailored to ensure substantially complete filling of the interior for different configurations, areas and manner of assembly of various microelectronic devices of the package with filler dielectric materials and substantially complete venting of air or other gas from the package interior which might result in voids or delamination.

Figure 13:
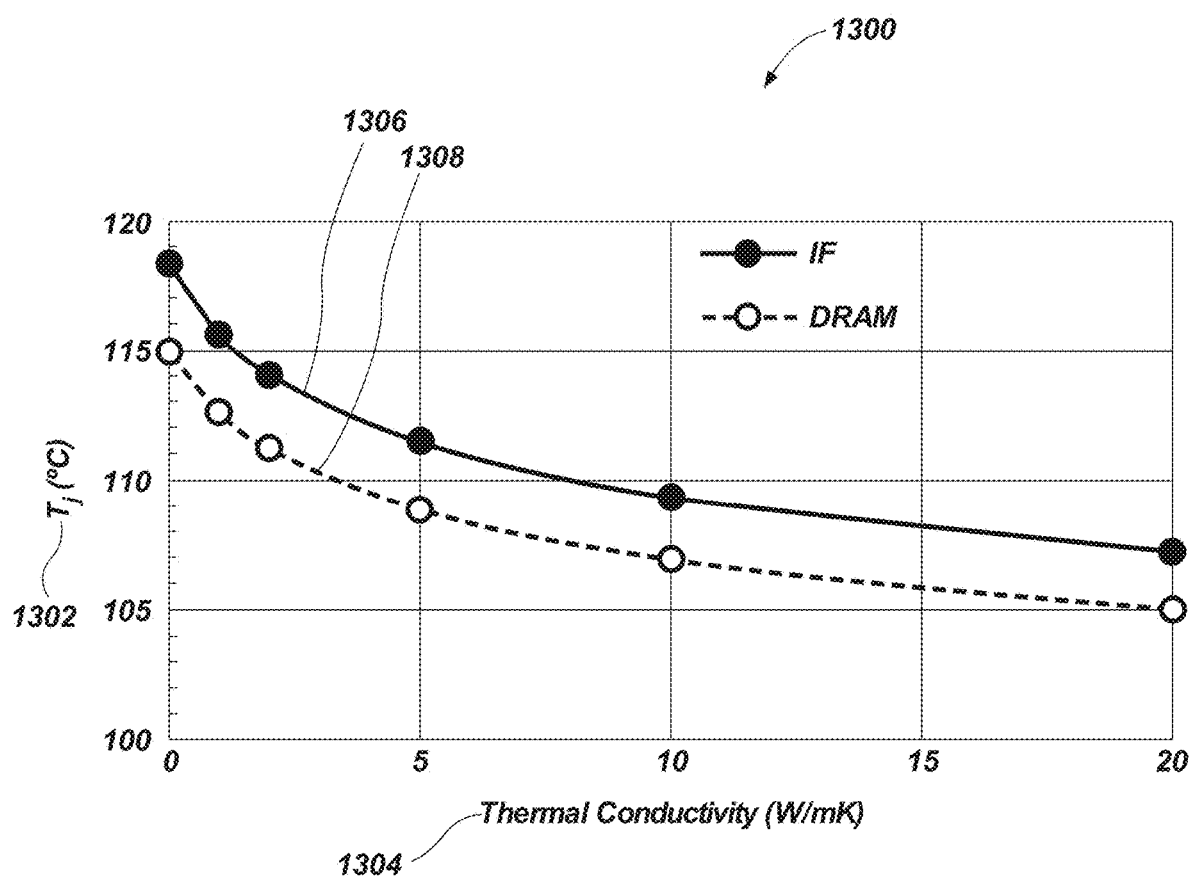
FIG. 13 illustrates a graphical representation of die temperature with respect to thermal conductivity of the fill dielectric material in accordance with an embodiment of the present disclosure.

FIG. 13 illustrates a graph 1300 representative of the temperature of different components of a lidded package 100, 400, 900 based on the thermal conductivity of the material in the space between the die stack 104, 424, 916 and the lid 102, 408, 902. The package temperature 1302 is illustrated on the vertical axis and the thermal conductivity of the material 1304 is illustrated on the horizontal axis. The temperatures of two different types of dice are illustrated on the graph 1300. The temperature of a Dynamic Random Access Memory die (DRAM die 1308) is illustrated in a broken line and the temperature of a relatively higher power die 1306, for example, a controller die, or a NAN Flash die is illustrated in a solid line.

If the space between the die stack 104, 424, 916 is a void (e.g., substantially free of fill dielectric material 504 or 908), the space may be substantially full of air. Air may have a thermal conductivity that is very low or substantially zero. If the space is substantially filled with a fill dielectric material 504 or 908 having a higher thermal conductivity than air the temperature of the dice may be reduced as illustrated in the graph 1300. If the space is substantially filled with a fill dielectric material 504 or 908 having a thermal conductivity of at least 5 W/mK the temperature of the higher power die 1306 and the DRAM die 1308 may drop by about seven degrees C.

Filling the space between the die stack 104, 424, 916 and the lid 102, 408, 902 with a fill dielectric material 504 or 908 having a higher thermal conductivity than air may reduce operating temperatures of the dice in the die stack 104, 424, 916. Reducing the operating temperatures of the die stack 104, 424, 916 may increase the operating life of the associated device, reduce the potential of the associated device to overheat, and/or reduce heat damage, such as warpage, broken connections, etc.

Some embodiments of the present disclosure may include a method of manufacturing a microelectronic device package. The method may include positioning a stack of semiconductor dice over a substrate. The method may further include securing a lid over the stack of semiconductor dice, the lid comprising at least one fill aperture and at least one vent aperture. The method may also include inserting a fill dielectric material through the at least one fill aperture into a volume between the lid and the substrate. The method may further include displacing gas within the volume through the at least one vent aperture with the fill dielectric material. The method may also include curing the fill dielectric material. The method may further include sealing the at least one vent aperture and the at least one fill aperture.

Figure 14:
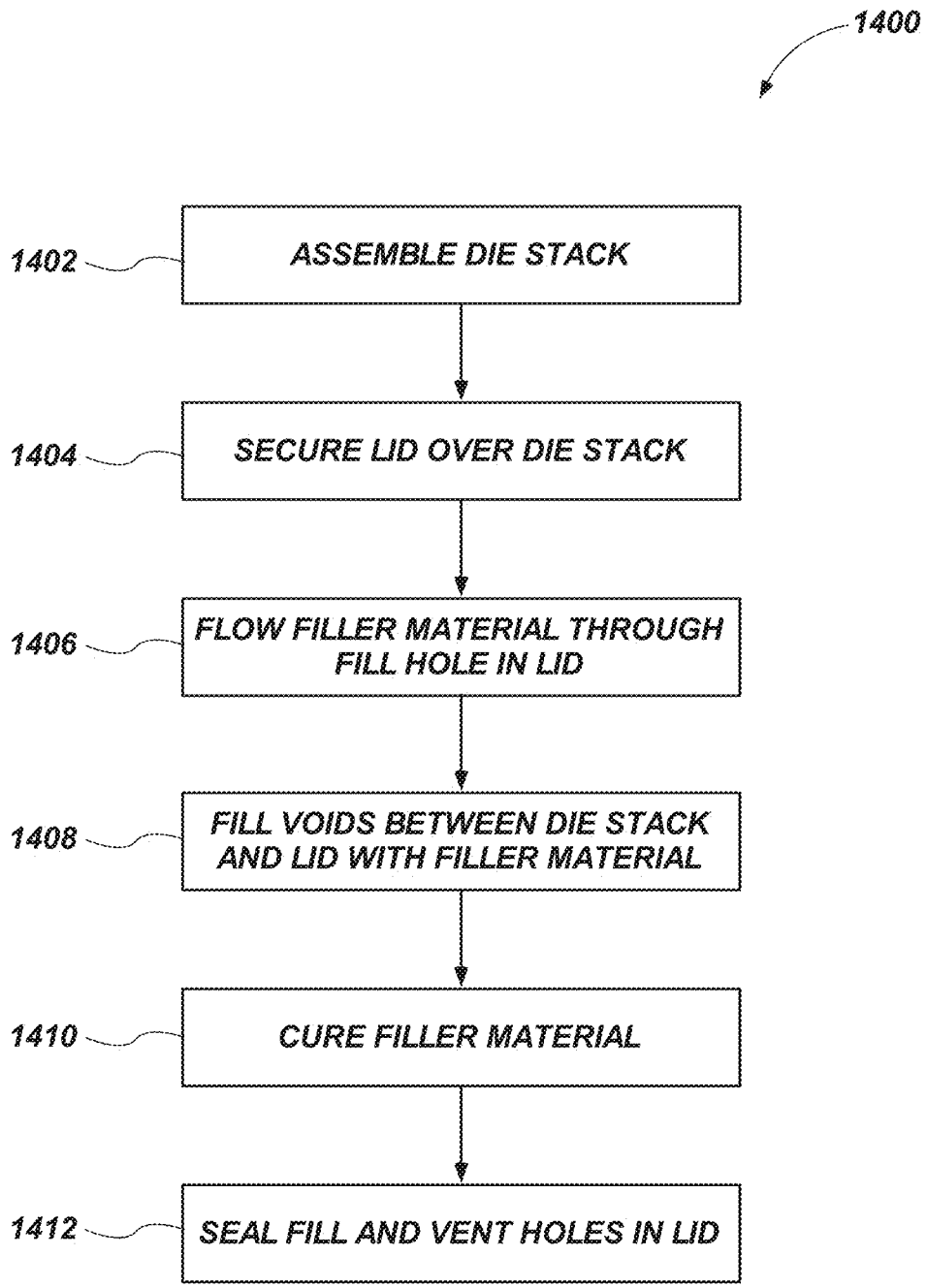
FIG. 14 illustrates a flow chart representative of a method of manufacturing a lidded package in accordance with an embodiment of the present disclosure.
Figure 15:
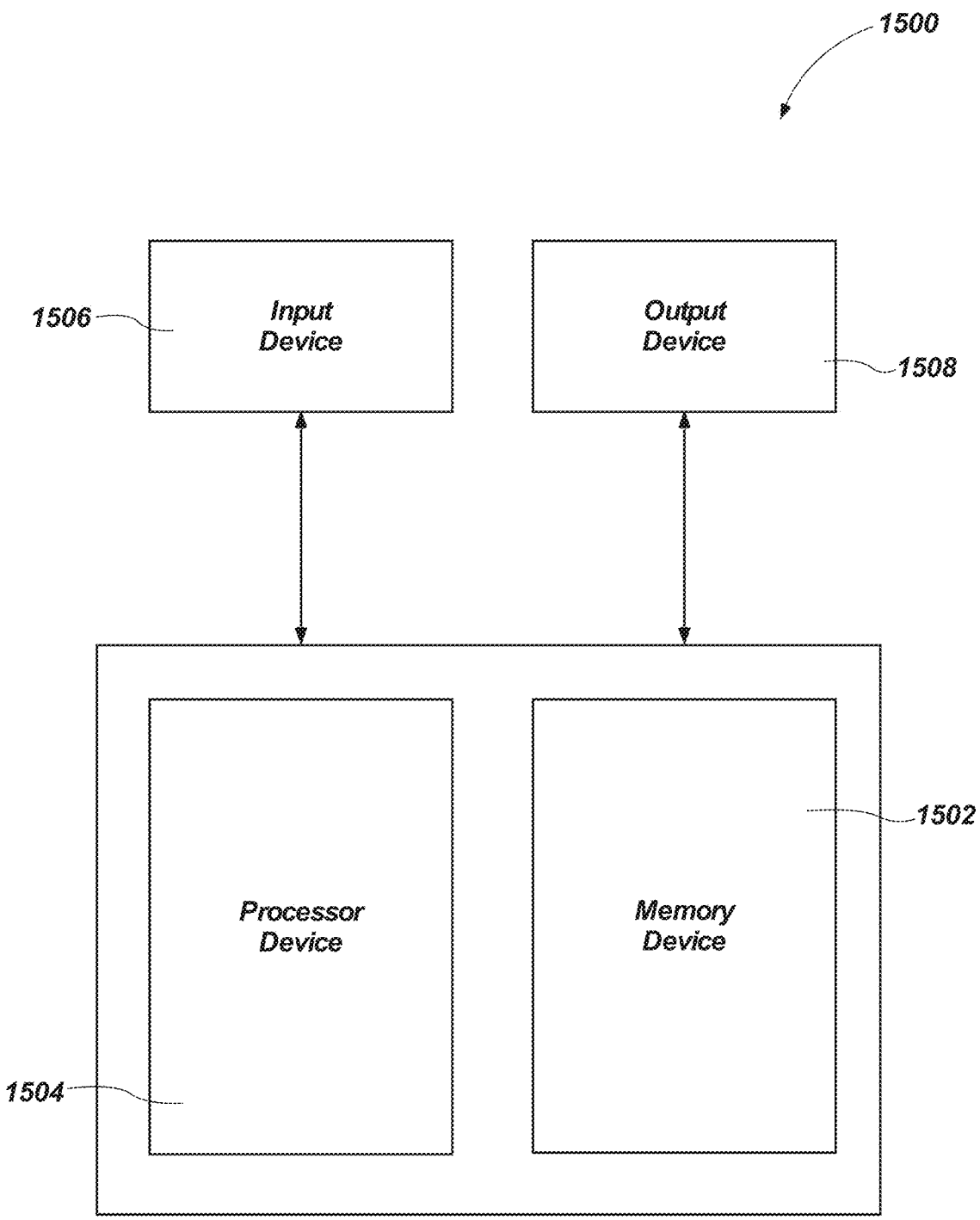
FIGS. 15 and 16 illustrate system diagrams in accordance with an embodiment of the present disclosure.

FIG. 14 illustrates a flow chart representative of a method of manufacturing a lidded package 1400, referring also to FIGS. 1-12. The die stack may be assembled in act 1402. In some embodiments, the die stack may be electrically coupled to a substrate. The substrate may be configured to electrically couple the die stack to an adjacent component through connection elements, such as solder bumps, studs, pillars, pins, etc. The die stack may include memory dice (e.g., DRAM dice), and one or more high power dice, such as a logic controller, microprocessor, etc.

A lid may be secured over the die stack in act 1404. The lid may be secured to the substrate with an adhesive layer. The adhesive layer may be configured to create a seal between the lid and the substrate. The lid may enclose a volume around the die stack. The enclosed volume may be defined by a space between the die stack and the lid. The lid may include one or more apertures or holes through the lid.

A filler material may be flowed into the volume between the lid and the die stack through the one or more holes in act 1406. As described above, the filler material may be a TIM material or an EMC material. The filler material may have a thermal conductivity that is at least higher than air. In some embodiments, the filler material may be flowed through the holes under pressure. For example, the filler material may be pressurized, such as through a pump, a compressor, a pressurized tank, etc. In some embodiments, the pressure inside the volume between the die stack and the lid may be reduced, such as through a suction or vacuum process, such that the pressure inside the space is less than a pressure of the filler material. In some embodiments, the holes and/or the spaces between the die stack and the lid may be sized such that the filler material may flow through the holes and around the die stack through a capillary process.

The air and/or other fluids and materials present in the volume between the die stack and the lid may be displaced by the filler material. As the air and/or other fluids and materials are displaced they may exit (e.g., escape, vent, etc.) from the volume between the die stack and the lid through one or more of the holes in the lid.

As the air and/or other fluids and materials exit from the volume between the die stack and the lid, the filler material may substantially fill all of the volume in act 1408. The filler material may be a material with a low viscosity such that the filler material may substantially fill all of the volume between the die stack and the lid. The air and/or other fluids and materials may all substantially exit the volume through the one or more holes such that substantially all of the air and/or other fluids and materials are substantially replaced by the filler material.

Once the space between the die stack and the lid is substantially filled with the filler material, the filler material may be cured in act 1410. The curing process may change a state of the filler material, such as from a liquid to a solid. For example, the curing process may include a heating process configured to solidify the filler material. In some embodiments, the curing process may include a chemical process configured to cause a chemical reaction in the filler material resulting in a solidification of the filler material. For example, the filler material may be mixed with an active ingredient, such as a hardener before or during the filling process where the filler material is flowed into the lidded package. The active ingredient may cause the filler material to harden through a chemical reaction. In some embodiments, the active ingredient may be activated by heat such that a heating process may cause the active ingredient to create a chemical reaction resulting in the curing and hardening of the filler material.

The one or more holes in the lid may be sealed in act 1412. In some embodiments, the filler material may substantially fill the one or more holes during the filling process. The curing process may harden the filler material in the one or more holes effectively sealing the one or more holes with the hardened filler material. In some embodiments, a separate material may be used to seal the holes. For example, a preformed plug configured to seal the one or more holes may be inserted into the one or more holes. In some embodiments, another material may be flowed into the one or more holes after the filler material is flowed through the one or more holes. In some embodiments, the other material may be configured to harden during the curing process. In some embodiments, the other material may be configured to harden before the curing process. In some embodiments, the other material may be flowed into the one or more holes after the curing process and may be configured to self-cure or to cure in a separate curing process.

Some embodiments of the present disclosure may include an electronic system. The electronic system may include a microelectronic device package including a high power semiconductor die over a substrate. The microelectronic device package may further include a lid over the high power semiconductor die, the lid substantially enclosing the high power semiconductor die between the lid and the substrate and defining a volume between the high power semiconductor die and the lid. The microelectronic device may also include a thermally conductive fill dielectric material substantially filling the space between the semiconductor die and the lid.

Microelectronic device packages formed according to the embodiments of the present disclosure may be used in embodiments of electronic systems of the disclosure. For example, FIG. 13 is a block diagram of an electronic system 1500, in accordance with embodiments of the disclosure. The electronic system 1500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 1500 includes at least one memory device 1502. The at least one memory device 1502 may include, for example, one or more microelectronic device packages according to embodiments of the disclosure.

The electronic system 1500 may further include at least one electronic signal processor device 1504 (often referred to as a "microprocessor"). The electronic signal processor device 1504 may include one or more microelectronic device packages according to embodiments of the disclosure. The electronic system 1500 may further include one or more input devices 1506 for inputting information into the electronic system 1500 by a user, such as, for example, a mouse or other pointing device, a keyboard, a touchpad, a button, or a control panel. The electronic system 1500 may further include one or more output devices 1508 for outputting information (e.g., visual or audio output) to a user such as, for example, a monitor, a display, a printer, an audio output jack, a speaker, etc. In some embodiments, the input device 1506 and the output device 1508 may comprise a single touchscreen device that can be used both to input information to the electronic system 1500 and to output visual information to a user. The input device 1506 and the output device 1508 may communicate electrically with one or more of the memory device 1502 and the electronic signal processor device 1504. At least some of the foregoing devices may be mounted to one or more substrates, for example, an interposer, a motherboard or other circuit board. In some embodiments, the processor device 1504, input device 1506, and/or output device 1508 may include one or more microelectronic devices according to embodiments of the disclosure.

Figure 16:
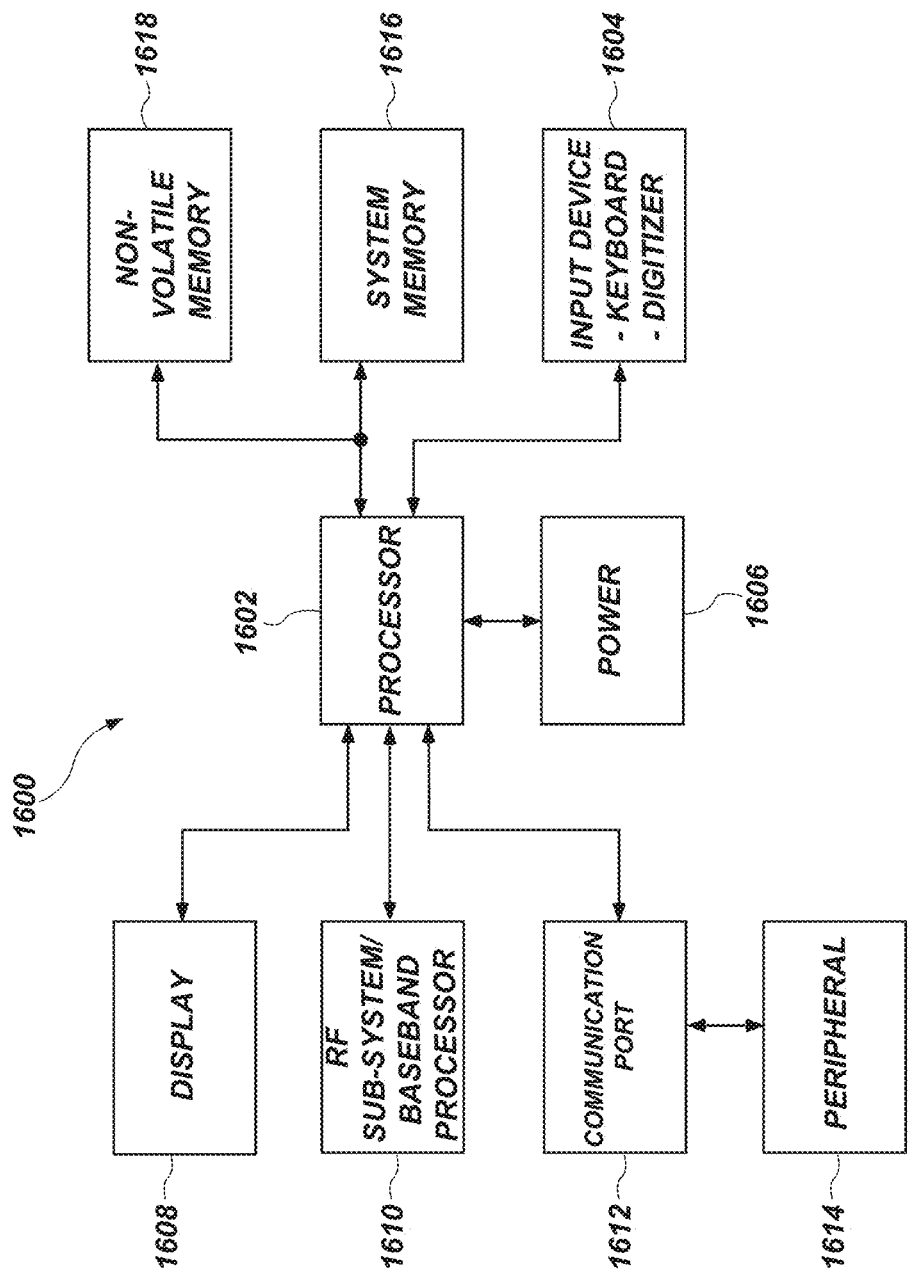

With reference to FIG. 16, depicted is a processor based system 1600. The processor based system 1600 may include various microelectronic components including microelectronic devices according to embodiments of the disclosure. The processor based system 1600 may be any of a variety of types such as a computer, pager, cellular phone, personal organizer, control circuit, or other electronic device. The processor based system 1600 may include one or more processors 1602, such as a microprocessor, to control the processing of system functions and requests in the processor based system 1600. The processor 1602 as well as some or all other subcomponents of the processor based system 1600 may include one or more microelectronic devices according to embodiments of the disclosure.

The processor based system 1600 may include a power supply 1606 in operable communication with the processor 1602. For example, if the processor based system 1600 is a portable system, the power supply 1606 may include one or more of a fuel cell, a power scavenging device, permanent batteries, replaceable batteries, and rechargeable batteries. The power supply 1606 may also include an AC adapter; therefore, the processor based system 1600 may be plugged into a wall outlet, for example. The power supply 1606 may also include a DC adapter such that the processor based system 1600 may be plugged into a vehicle cigarette lighter or a vehicle power port, for example.

Various other components may be coupled to the processor 1602 depending on the functions that the processor based system 1600 performs. For example, a user interface 1604 may be coupled to the processor 1602. The user interface 1604 may include input devices such as buttons, switches, a keyboard, a light pen, a mouse, a digitizer and stylus, a touch screen, a voice recognition system, a microphone, or a combination thereof. A display 1608 may also be coupled to the processor 1602. The display 1608 may include an LCD display, an SED display, a CRT display, a DLP display, a plasma display, an OLED display, an LED display, a three-dimensional projection, an audio display, or a combination thereof. Furthermore, an RF sub-system/baseband processor 1610 may also be coupled to the processor 1602. The RF sub-system/baseband processor 1610 may include an antenna that is coupled to an RF receiver and to an RF transmitter (not shown). A communication port 1612, or more than one communication port 1612, may also be coupled to the processor 1602. The communication port 1612 may be adapted to be coupled to one or more peripheral devices 1614, such as a modem, a printer, a computer, a scanner, or a camera, or to a network, such as a local area network, remote area network, intranet, or the Internet, for example.

The processor 1602 may control the processor based system 1600 by implementing software programs stored in the memory. The software programs may include an operating system, database software, drafting software, word processing software, media editing software, or media playing software, for example. The memory is operably coupled to the processor 1602 to store and facilitate execution of various programs. For example, the processor 1602 may be coupled to system memory 1616, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1616 may include volatile memory, non-volatile memory, or a combination thereof. The system memory 1616 is typically large so that it can store dynamically loaded applications and data. In some embodiments, the system memory 1616 may include one or more microelectronic components including microelectronic device packages according to embodiments of the disclosure.

The processor 1602 may also be coupled to non-volatile memory 1618, which is not to suggest that system memory 1616 is necessarily volatile. The non-volatile memory 1618 may include one or more of STT-MRAM, MRAM, read-only memory (ROM) such as an EPROM, resistive read-only memory (RROM), and flash memory to be used in conjunction with the system memory 1616. The size of the non-volatile memory 1618 is typically selected to be just large enough to store any necessary operating system, application programs, and fixed data. Additionally, the non-volatile memory 1618 may include a high-capacity memory such as disk drive memory, such as a hybrid-drive including resistive memory or other types of non-volatile solid-state memory, for example. The non-volatile memory 1618 may include microelectronic components including microelectronic device packages according to embodiments of the disclosure.

The embodiments of the present disclosure may improve the heat dissipation of lidded microelectronic devices. Improving the heat dissipation of the lidded microelectronic devices may increase an operating life of the lidded microelectronic devices. Improving the heat dissipation of the lidded microelectronic devices may substantially prevent premature failures attributed to overheating. Improving the heat dissipation of lidded microelectronic devices may further enable relatively higher power dice to be used and/or allow for smaller relatively higher power dice.

Relatively higher power dice and/or smaller higher power dice or die stacks may enable the sizes of microelectronic components to be reduced. Reducing the size of microelectronic components may allow for reduced sizes of the associated electronic device packages or systems incorporating same. In some embodiments, reducing the size of higher power components may allow smaller electronic device packages to exhibit increased memory, processing speed, etc.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A microelectronic device comprising:
semiconductor dice over a substrate, the semiconductor dice including a high power die positioned vertically between two other dice of the semiconductor dice;
a lid extending over the semiconductor dice, enclosing the semiconductor dice between the lid and the substrate and defining a volume between the semiconductor dice and the lid; and
at least one fill dielectric material substantially filling the volume between the semiconductor dice and the lid.

2. The microelectronic device of claim 1, further comprising at least one fill aperture and at least one vent aperture.

3. The microelectronic device of claim 1, wherein the at least one fill dielectric material comprises a thermal interface material (TIM).

4. The microelectronic device of claim 1, wherein the at least one fill dielectric material comprises at least two layers.

5. The microelectronic device of claim 4, wherein a first layer of the at least two layers of the at least one fill dielectric material comprises an epoxy molding compound (EMC) and a second layer of the at least two layers of the at least one fill dielectric material comprises a thermal interface material (TIM).

6. The microelectronic device of claim 5, wherein the second layer of the at least two layers of the at least one fill dielectric material is adjacent to the high power die.

7. The microelectronic device of claim 6, wherein the second layer of the at least two layers of the at least one fill dielectric material is in direct contact with both the high power die and the lid, and the second layer is configured to thermally couple the high power die to the lid.

8. The microelectronic device of claim 1, wherein the semiconductor dice are configured in a die stack.

9. A method of forming a microelectronic device comprising:
positioning semiconductor dice over a substrate;
positioning a high power die vertically between two other dice of the semiconductor dice;
enclosing the semiconductor dice between a lid and the substrate, the lid extending over the semiconductor dice and defining a volume between the semiconductor dice and the lid; and
substantially filling the volume between the semiconductor dice and the lid with at least one fill dielectric material.

10. The method of claim 9, wherein substantially filling the volume with the at least one fill dielectric material comprises inserting the at least one fill dielectric material through at least one fill aperture in the lid and venting gas within the volume through at least one vent aperture.

11. The method of claim 10, wherein substantially filling the volume with the at least one fill dielectric material comprises inserting the at least one fill dielectric material at least until the at least one fill dielectric material begins to exit the lid through the at least one vent aperture.

12. The method of claim 10, further comprising sealing the at least one fill aperture and the at least one vent aperture.

13. The method of claim 12, wherein sealing the at least one fill aperture and the at least one vent aperture comprises curing the at least one fill dielectric material in the at least one vent aperture and the at least one fill aperture.

14. The method of claim 9, further comprising curing the at least one fill dielectric material.

15. The method of claim 9, wherein substantially filling the volume between the semiconductor dice and the lid with the at least one fill dielectric material further comprises forming at least two layers of the at least one fill dielectric material.

16. The method of claim 15, wherein substantially filling the volume between the semiconductor dice and the lid with the at least one fill dielectric material comprises:
forming a first layer of an epoxy molding compound (EMC); and
forming a second layer of a thermal interface material (TIM).

17. The method of claim 16, wherein forming the second layer of the TIM comprises forming the second layer of the TIM in contact with the high power die.

18. The method of claim 17, further comprising thermally coupling the high power die to the lid with the second layer of the TIM.

19. A microelectronic device comprising:
a stack of semiconductor dice including a high power die positioned between two other dice of the stack of semiconductor dice;
a lid extending over the semiconductor dice defining a volume between the semiconductor dice and the lid; and
the volume between the semiconductor dice and the lid substantially filled with a dielectric material, the dielectric material including a thermal interface material (TIM) thermally coupling the high power die to the lid.

20. The microelectronic device of claim 19, wherein the dielectric material comprises at least two layers, a first layer including the TIM and a second layer including an epoxy molding compound (EMC).

* * * * *